US010373853B2

(12) United States Patent
Anada et al.

(10) Patent No.: US 10,373,853 B2
(45) Date of Patent: Aug. 6, 2019

(54) ELECTROSTATIC CHUCK AND WAFER PROCESSING APPARATUS

(71) Applicant: TOTO LTD., Kitakyushu-shi, Fukuoka (JP)

(72) Inventors: Kazuki Anada, Fukuoka (JP); Yuichi Yoshii, Fukuoka (JP)

(73) Assignee: Toto Ltd., Fukuoka (JP)

(*) Notice: Subject to any disclaimer, the term of this patent is extended or adjusted under 35 U.S.C. 154(b) by 96 days.

(21) Appl. No.: 15/534,798

(22) PCT Filed: Dec. 10, 2015

(86) PCT No.: PCT/JP2015/084611
§ 371 (c)(1),
(2) Date: Jun. 9, 2017

(87) PCT Pub. No.: WO2016/093297
PCT Pub. Date: Jun. 16, 2016

(65) Prior Publication Data
US 2018/0261486 A1 Sep. 13, 2018

(30) Foreign Application Priority Data

Dec. 10, 2014 (JP) .................................. 2014-249729
Dec. 7, 2015 (JP) .................................. 2015-238822

(51) Int. Cl.
H01L 21/683 (2006.01)
H01L 21/67 (2006.01)
B23B 31/28 (2006.01)

(52) U.S. Cl.
CPC .... H01L 21/6833 (2013.01); H01L 21/67103 (2013.01); B23B 31/28 (2013.01); Y10T 279/23 (2015.01)

(58) Field of Classification Search
CPC ................ B23B 31/28; H01L 21/6833; H01L 21/67103; H05B 3/143; Y10T 279/23
(Continued)

(56) References Cited

U.S. PATENT DOCUMENTS 5,792,304 A * 8/1998 Tamura ............. H01L 21/67109
118/724
6,215,643 B1 * 4/2001 Nagasaki ............ H01L 21/6833
279/128
(Continued)

FOREIGN PATENT DOCUMENTS

JP H08-125001 A 5/1996
JP WO 2005008749 A1 * 1/2005 ....... H01L 21/67103

OTHER PUBLICATIONS

Machine Translation, Japan Patent Document, JP 08-125001A, Sakakibara, Y., May 17, 1996.*

Primary Examiner — Eric A Gates
Assistant Examiner — Chwen-Wei Su
(74) Attorney, Agent, or Firm — Carrier Blackman & Associates, P.C.; William D. Blackman; Joseph P. Carrier

(57) ABSTRACT

An electrostatic chuck includes a ceramic dielectric substrate having a first major surface on which an object to be processed is mounted, and a second major surface, the ceramic dielectric substrate being a polycrystalline ceramic sintered body, an electrode layer provided on the ceramic dielectric substrate, a base plate provided on a side of the second major surface and supporting the ceramic dielectric substrate, and a heater provided between the electrode layer and the base plate. The base plate includes a through hole piercing the base plate and a communication path passing a medium adjusting a temperature of the object to be processed, and when viewed in a direction perpendicular to the first major surface, at least a part of the heater exists on a side
(Continued)

of the through hole as viewed from a first portion of the communication path which is closest to the through hole.

13 Claims, 16 Drawing Sheets

(58) Field of Classification Search
USPC .................................................. 219/444.1
See application file for complete search history.

(56) References Cited

U.S. PATENT DOCUMENTS

| | | | |
|---|---|---|---|
| 7,126,092 B2* | 10/2006 | Lin ................... | H01L 21/67103 |
| | | | 219/444.1 |
| 7,554,059 B2* | 6/2009 | Awazu .............. | H01L 21/67109 |
| | | | 118/50.1 |
| 8,226,769 B2* | 7/2012 | Matyushkin ...... | H01L 21/67109 |
| | | | 118/725 |
| 9,799,545 B2* | 10/2017 | Yamasaki ............... | H02N 13/00 |
| 2006/0221539 A1 | 10/2006 | Morita et al. | |
| 2014/0063682 A1 | 3/2014 | Anada et al. | |
| 2015/0270149 A1* | 9/2015 | Kuribayashi ..... | H01L 21/67248 |
| | | | 219/444.1 |
| 2016/0126125 A1* | 5/2016 | Okugawa .......... | H01L 21/67103 |
| | | | 219/444.1 |

\* cited by examiner

| | DISTANCE OF CLOSEST APPROACH/ DISTANCE BETWEEN ROUND END PORTIONS | TEMPERATURE DIFFERENCE IN PLANE OF OBJECT TO BE PROCESSED (°C) |
|---|---|---|
| Case1 | 22% | 3.453 |
| Case2 | 26% | 1.797 |
| Case3 | 33% | 1.689 |
| Case4 | 50% | 1.011 |
| Case5 | 67% | 0.684 |
| Case6 | 80% | 0.648 |

Case1

Case4

Case2

Case5

Case3

ELECTROSTATIC CHUCK AND WAFER PROCESSING APPARATUS

TECHNICAL FIELD

An aspect of the invention generally relates to an electrostatic chuck and a wafer processing apparatus.

BACKGROUND ART

Electrostatic chucks are used as means to adhere and hold an object to be processed (such as a semiconductor wafer or a glass substrate) in a plasma processing chamber that performs etching, chemical vapor deposition (CVD), sputtering, ion implantation, ashing, and the like.

Electrostatic chucks are fabricated by interposing an electrode between ceramic substrates of alumina or the like and sintering the arrangement. Electrostatic chucks apply an electrostatic adhesion-use power to the internal electrode and thereby adhere a substrate such as a silicon wafer or the like by an electrostatic force.

Recently, in an etching apparatus based on plasma, there is a trend of higher output of plasma. With the higher output of plasma, the heat amount supplied to the wafer is increased. In the case where the heat amount supplied to the plasma is relatively low, a temperature change of the electrostatic chuck is relatively small and a relatively small chiller is available. In the case where the heat amount supplied to the wafer is relatively low, use of a cooling metal plate which does not need a coolant and change of the chiller temperature are sufficiently available so that the wafer is set to a desired temperature in the processing.

However, as the heat amount supplied to the wafer is relatively increased and the temperature of the ceramic base material is increased, the temperature of the wafer is increased. Then, there is a problem that materials which can be used for the wafer processing are limited to high heat resistance material.

On the other hand, there is an electrostatic chuck having a built-in heater for uniformization of the temperature distribution in the plane of the wafer.

Uniformity of the temperature distribution in the plane of the wafer is desired.

CITATION LIST

Patent Literature

[Patent Document 1] JP 2008-300491 A (Kokai)
[Patent Document 2] JP 2004-312026 A (Kokai)

SUMMARY OF INVENTION

Technical Problem

The invention has been made based on the recognition of such a problem, and an object of the invention is to provide an electrostatic chuck and a wafer processing apparatus capable of improving uniformity of the temperature distribution in a plane of an object to be processed.

Solution to Problem

According to one embodiment of the invention, an electrostatic chuck is provided. The electrostatic chuck includes a ceramic dielectric substrate having a first major surface on which an object to be processed is mounted, and a second major surface on a side opposite to the first major surface, the ceramic dielectric substrate being a polycrystalline ceramic sintered body, an electrode layer provided on the ceramic dielectric substrate, a base plate provided on a side of the second major surface and supporting the ceramic dielectric substrate, and a heater provided between the electrode layer and the base plate. The base plate includes a through hole piercing the base plate and a communication path passing a medium adjusting a temperature of the object to be processed, and when viewed in a direction perpendicular to the first major surface, at least a part of the heater exists on a side of the through hole as viewed from a first portion of the communication path which is closest to the through hole.

DESCRIPTION OF EMBODIMENT

Figure 1:
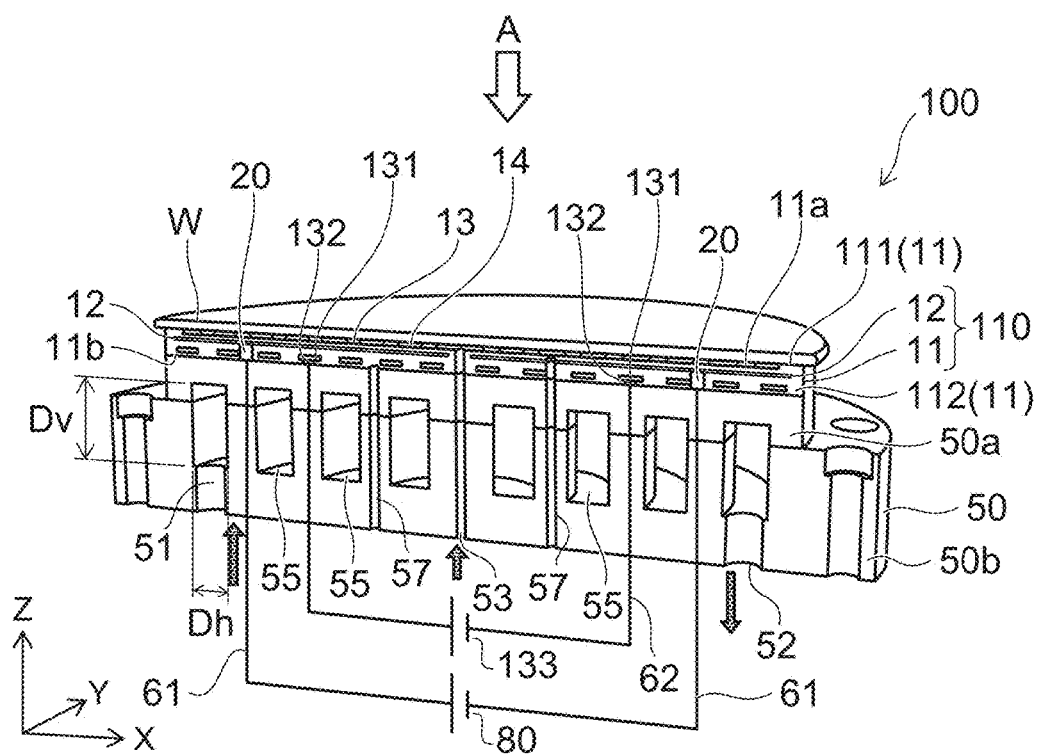
FIG. 1 is a schematic cross-sectional view illustrating the configuration of an electrostatic chuck according to the embodiment.

A first aspect of the invention is an electrostatic chuck including a ceramic dielectric substrate having a first major surface on which an object to be processed is mounted, and a second major surface on a side opposite to the first major surface, the ceramic dielectric substrate being a polycrystalline ceramic sintered body, an electrode layer provided on the ceramic dielectric substrate, a base plate provided on a side of the second major surface and supporting the ceramic dielectric substrate, and a heater provided between the electrode layer and the base plate, the base plate including a through hole piercing the base plate and a communication path passing a medium adjusting a temperature of the object to be processed, and when viewed in a direction perpendicular to the first major surface, at least a part of the heater existing on a side of the through hole as viewed from a first portion of the communication path which is closest to the through hole.

According to this electrostatic chuck, the uncontrollable range of temperature adjustment within the plane of the object to be processed can be limited by equalizing substantially a portion hardest to heat to a portion hardest to cool. Thereby, the uniformity of the temperature distribution in the plane of the object to be processed in other region different from the through hole can be improved. Also in the vicinity of the through hole, a region of cool spot hardest to heat is substantially equal to a region of hot spot hardest to cool, and thus equilibrium between heating and cooling is easily achieved, and the uniformity of the temperature distribution in the plane of the object to be processed can be improved.

A second aspect of the invention is an electrostatic chuck according to the first aspect of the invention, wherein when viewed in a perpendicular direction to the first major surface, a distance between the first portion and a center axis of the through hole is larger than a distance between a second portion of the heater closest to the through hole and the center axis of the through hole.

According to the electrostatic chuck, the uncontrollable range of temperature adjustment in the plane of the object to be processed can be limited by equalizing substantially a portion hardest to heat to a portion hardest to cool. Thereby, the uniformity of the temperature distribution in the plane of the object to be processed in other region different from the through hole can be improved.

A third aspect of the invention is an electrostatic chuck according to the second aspect of the invention, wherein when viewed in the direction perpendicular to the first major surface, a distance between a center of a first virtual circle passing the first portion and any two portions on the side of the through hole of the communication path and a center of a second virtual circle passing the second portion and any two portions on the side of the through hole of the heater is not more than 0.2 millimeters.

According to the electrostatic chuck, the uncontrollable range of temperature adjustment in the plane of the object to be processed can be limited by equalizing substantially a portion hardest to heat to a portion hardest to cool. Thereby, the uniformity of the temperature distribution in the plane of the object to be processed in other region different from the through hole can be improved.

A fourth aspect of the invention is an electrostatic chuck according to the third aspect of the invention, wherein when viewed in the direction perpendicular to the first major surface, a center of a first virtual circle passing the first portion and any two portions on the side of the through hole of the communication path overlaps a center of a second virtual circle passing the second portion and any two portions on the side of the through hole of the heater.

According to the electrostatic chuck, the uncontrollable range of temperature adjustment in the plane of the object to be processed can be limited by equalizing substantially a portion hardest to heat to a portion hardest to cool. Thereby, the uniformity of the temperature distribution in the plane of the object to be processed in other region different from the through hole can be improved.

A fifth aspect of the invention is an electrostatic chuck according to one of the second to fourth aspects of the invention, wherein when viewed in the direction perpendicular to the first major surface, a width of the communication path in the first portion is wider than a width of the heater in the second portion.

According to the electrostatic chuck, the uncontrollable range of temperature adjustment in the plane of the object to be processed can be limited by equalizing substantially a portion hardest to heat to a portion hardest to cool. Thereby, the uniformity of the temperature distribution in the plane of the object to be processed in other region different from the through hole can be improved.

A sixth aspect of the invention is an electrostatic chuck according to the third or fourth aspect of the invention, wherein when viewed in the direction perpendicular to the first major surface, a length of a portion where the second virtual circle crosses the heater is not less than 50 percent and not more than 80 percent of a length of circle perimeter of the second virtual circle.

According to the electrostatic chuck, the uncontrollable range of temperature adjustment in the plane of the object to be processed can be limited by equalizing substantially a portion hardest to heat to a portion hardest to cool. Thereby, the uniformity of the temperature distribution in the plane of the object to be processed in other region different from the through hole can be improved.

A seventh aspect of the invention is an electrostatic chuck according to one of the first to sixth aspects of the inventions, wherein the heater includes a first heater having a first folded-back portion bent from a first direction to a second direction different from the first direction, and a second heater having a second folded-back portion provided to be close to the first heater and bent from a third direction to a fourth direction different from the third direction, a distance of closest approach between the first folded-back portion and the second folded-back portion is not less than 50 percent and less than 100 percent of a distance between a round end portion of the first folded-back portion and a round end portion of the second folded-back portion.

According to the electrostatic chuck, the distance of closest approach between the multiple heaters 131 is defined in order to define a density of the space portion 141 in the portion of the closest folded-back portions 131e of the multiple heaters 131, and thus the temperature controllability of the object to be processed W can be improved and the uniformity of the temperature distribution of the object to be processed can be improved.

An eighth aspect of the invention is an electrostatic chuck according to one of the first to seventh aspects of the invention, wherein when viewed in the direction perpendicular to the first major surface, a ratio of an area of the heater to an area of the ceramic dielectric substrate is not less than 20% and not more than 80%.

According to the electrostatic chuck, the uniformity of the temperature distribution in the plane of the object to be processed can be improved by arranging the heaters with an adequate density.

A ninth aspect of the invention is an electrostatic chuck according to one of the first to eighth aspects of the invention, wherein when viewed in the direction perpendicular to the first major surface, a ratio of an area of the communication path to an area of the ceramic dielectric substrate is not less than 20% and not more than 80%.

According to the electrostatic chuck, the uniformity of the temperature distribution in the plane of the object to be processed can be improved by arranging the communication paths with an adequate density.

A tenth aspect of the invention is an electrostatic chuck according to one of the first to ninth aspects of the invention, wherein when viewed in the direction perpendicular to the first major surface, a ratio of an area of the heater to an area of the communication path is not less than 60% and not more than 180%.

According to the electrostatic chuck, the uniformity of the temperature distribution in the plane of the object to be processed can be improved by arranging both of the communication paths and the heaters with an adequate density.

An eleventh aspect of the invention is an electrostatic chuck according to one of the first to tenth aspects of the invention, further including a plurality of bypass electrodes provided between the electrode layer and the base plate and electrically connected to the heater, a distance between mutually adjacent bypass electrodes of the plurality of bypass electrodes being not less than 0.05 millimeters and not more than 10 millimeters.

According to the electrostatic chuck, the freedom of arrangement of the terminal 62 and the heater 131 can be improved by providing the bypass electrode. Furthermore, ununiformity of heat conduction due to a gap between the bypass electrodes is suppressed by defining a gap width between the bypass electrodes. Thereby, the uniformity of the temperature distribution of the object to be processed can be improved.

A twelfth aspect of the invention is an electrostatic chuck according to one of the first to tenth aspects of the invention, further including a plurality of bypass electrodes provided between the electrode layer and the base plate and electrically connected to the heater, a length along the direction perpendicular to the first major surface of a region between mutually adjacent bypass electrodes of the plurality of bypass electrodes being not less than 0.01 millimeters and not more than 1 millimeter.

According to the electrostatic chuck, the freedom of arrangement of the terminal 62 and the heater 131 can be improved by providing the bypass electrode. Furthermore, ununiformity of heat conduction due to a gap between the bypass electrodes is suppressed by defining a gap width between the bypass electrodes. Thereby, the uniformity of the temperature distribution of the object to be processed can be improved.

A thirteenth aspect of the invention is a wafer processing apparatus including the electrostatic chuck according to one of the first to twelfth aspects of the invention.

According to the wafer processing apparatus, the uniformity of the temperature distribution of the object to be processed can be improved.

Embodiments of the invention will now be described with reference to the drawings. Note that the same numerals are applied to similar constituent elements in the drawings and detailed descriptions of such constituent elements are appropriately omitted.

FIG. 1 is a schematic cross-sectional view illustrating the configuration of an electrostatic chuck according to the embodiment.

As shown in FIG. 1, an electrostatic chuck 100 according to the embodiment includes a ceramic dielectric substrate 11, an electrode layer 12, a heater 131, and a base plate 50. The ceramic dielectric substrate 11 is attached on the base plate 50.

The ceramic dielectric substrate 11 is, for example, a flat plate-like substrate made of a polycrystalline ceramic sintered body, and includes a first major surface 11a on which an object to be processed W such as a semiconductor wafer or the like is mounted, and a second major surface 11b on a side opposite the first major surface 11a.

The material of the crystals included in the ceramic dielectric substrate 11 may include, for example, $Al_2O_3$, $Y_2O_3$ and YAG. By using this material, it is possible to increase the transmittivity of infrared light, the insulation resistance, and the plasma durability of the ceramic dielectric substrate 11.

The electrode layer 12 is interposed between the first major surface 11a and the second major surface 11b. In other words, the electrode layer 12 is formed so as to be inserted into the ceramic dielectric substrate 11. The electrode layer 12 is integrally sintered with the ceramic dielectric substrate 11. An electrostatic chuck substrate 110 is a plate-like structure that includes the ceramic dielectric substrate 11 and the electrode layer 12 provided in the ceramic dielectric substrate 11.

The electrode layer 12 is not limited to be interposed between the first major surface 11a and the second major surface 11b, and may be attached to the second major surface 11b. Thus, the electrode layer 12 is not limited to be integrally sintered with the ceramic dielectric substrate 11.

The electrostatic chuck 100 applies an adhere and hold voltage 80 to the electrode layer 12, thereby generating charge on the first major surface 11a side of the electrode layer 12 and using a resulting electrostatic force to adhere and hold the object to be processed W. A heater current 133 passes through a heater electrode current introduction portion 132, thereby the heater 131 generates heat and can increase the temperature of the object to be processed W.

The ceramic dielectric substrate 11 includes a first dielectric layer 111 between the electrode layer 12 and the first major surface 11a, and a second dielectric layer 112 between the electrode layer 12 and the second major surface 11b. For example, the heater 131 is included in the second dielectric layer 112. However, the form of the heater is not limited to an internal type, but it may be produced by forming a concave portion in the first dielectric layer 111 or the second dielectric layer 112 and connecting a heater metal thereto, or by connecting or laminating a dielectric body that includes a heater to the second dielectric layer. Also, there is no limitation to the shape of a heater electrode current introduction part 132, a metal embedding, joint, or shape.

In the electrostatic chuck shown in FIG. 1, the heater 131 is provided on a side of the electrode layer 12 from the second major surface 11b. However, the heater 131 may be provided at the same position as the second major surface 11b, and may be provided on an opposite side to the electrode layer 12 as viewed from the second major surface 11b.

In the case where the heater 131 is provided on the electrode layer 12 side from the second major surface 11b, for example, the heater may be included in a sintered body formed by sintering stacked green sheets on which the electrode and the heater are printed.

In the case where the heater is provided at the same position as the second major surface 11b, for example, the heater may be formed by an appropriate method such as screen printing or the like on the second major surface 11b, or may be formed by PVD (Physical Vapor Deposition), CVD (Chemical Vapor Deposition) or the like.

In the embodiment, it is sufficient that the heater 131 can be used for controlling the temperature distribution in the plane of the object to be processed W, the position and the structure or the like of the heater 131 are not particularly limited. For example, the heater may be provided inside the ceramic dielectric substrate 11, or may be provided as a member different from the ceramic dielectric substrate 11. The heater 131 may be interposed between the base plate 50 and the ceramic dielectric substrate 11. The heater 131 may be a plate of a conductor or an insulator, or a heater plate including a thermoelectric element. The heater 131 may be included in the ceramic, and the second major surface 11b side of the ceramic dielectric substrate 11 may be coated. A manufacturing method of the heater 131 is not particularly limited.

In the description of the embodiment, the direction that joins the second major surface 11b and the first major surface 11a is denoted as the Z direction, one of the directions perpendicular to the Z direction is denoted as the X direction, and the direction perpendicular to the Z direction and the X direction is denoted as the Y direction.

The electrode layer 12 is provided along the first major surface 11a and the second major surface 11b. The electrode layer 12 is an adhering electrode for adhering and holding the object to be processed W. The electrode layer 12 may be a unipolar type or a bipolar type. Also, the electrode layer 12 may be a tripolar type or another multi-polar type. The number electrode layers 12 and the arrangement of electrode layers 12 are selected as appropriate. The electrode layer 12 shown in FIG. 1 is of the bipolar type, and the electrode layer 12 of two poles is provided in the same plane.

It is favorable that at least the first dielectric layer 111 of the ceramic dielectric substrate 11 has an infrared spectral transmittance of not less than 20%. In the embodiment, the infrared spectral transmittance is the value in terms of a thickness of 1 mm.

By making the infrared spectral transmittance of at least the first dielectric layer 111 of the ceramic dielectric substrate 11 not less than 20%, the infrared light emitted from the heater 131 when the object to be processed W is mounted on the first major surface 11a can efficiently pass through the ceramic dielectric substrate 11. Therefore, it is difficult for heat to accumulate in the object to be processed W, and the controllability of the temperature of the object to be processed W is increased.

For example, if the electrostatic chuck 100 is used within a chamber where plasma processing is carried out, the temperature of the object to be processed W can easily rise as the plasma power is increased. In the electrostatic chuck 100 according to the embodiment, the heat transmitted to the object to be processed W by the plasma power is efficiently transmitted to the ceramic dielectric substrate 11. In addition, heat that has been transmitted to the ceramic dielectric substrate 11 by the heater 131 is efficiently transmitted to the object to be processed W. Therefore, the object to be processed W can be efficiently heated and maintained at its desired temperature.

In the electrostatic chuck 100 according to this embodiment, preferably, the infrared spectral transmittance of the second dielectric layer 112 is not less than 20%, in addition to the first dielectric layer 111. By making the infrared spectral transmittance of the first dielectric layer 111 and the second dielectric layer 112 not less than 20%, the infrared light emitted from the heater 131 is more efficiently transmitted through the ceramic dielectric substrate 11, so it is possible to improve the controllability of the temperature of the object to be processed W.

As described above, the ceramic dielectric substrate 11 is attached to the base plate 50. When attaching the ceramic dielectric substrate 11 to the base plate 50, a heat-resistant resin such as silicone or the like, indium bonding, brazing, or the like can be used. The bonding material is selected as appropriately based on the range of temperature used, cost, and the like, but more preferably, the bonding material easily transmits infrared light.

The base plate 50 is, for example, divided into an upper portion 50a and a lower portion 50b made of aluminum. Brazing, electron beam welding, and diffusion bonding or the like can be used for connection of an upper portion 50a and a lower portion 50b. However, a manufacturing method of the base plate 50 is not limited to the above.

A communication path 55 is provided in a boundary portion between the upper portion 50a and the lower portion 50b. That is, the communication path 55 is provided inside the base plate 50. One end of the communication path 55 is connected to an input path 51. The other end of the communication path 55 is connected to an output path 52.

The base plate 50 plays the role of adjusting the temperature of the ceramic dielectric substrate 11. For example, when the ceramic dielectric substrate 11 is cooled, a cooling medium is caused to flow into the communication path 55 through the input path 51, pass through the communication path 55, and flow out from the communication path 50 through the output path 52. Accordingly, heat from the base plate 50 is absorbed by the cooling medium, and the ceramic dielectric substrate 11 attached to the base plate 50 can be cooled.

On the other hand, when the ceramic dielectric substrate 11 is heated, a heating medium can be supplied within the communication path 55. Alternatively, the heater 131 can be included in the base plate 50. In this way, when the temperature of the ceramic dielectric substrate 11 is adjusted by the base plate 50, the temperature of the object to be processed W adhered and held by the electrostatic chuck 100 can be easily adjusted.

In the cross section of FIG. 1, a horizontal dimension Dh (corresponding to a width D3 described later) of the communication path 55 is smaller than a vertical dimension Dv (a length along the Z-direction) of the communication path 55. Thereby, while improving the controllability of the range where the medium adjusting the temperature flows, a ratio of a region provided with the communication path 55 as viewed along a direction perpendicular to the first major surface 11a can be high. For example, while suppressing a pressure loss of the medium adjusting the temperature, the in-plane uniformity of the temperature of the object to be processed W can be improved.

Also, on the first major surface 11a side of the ceramic dielectric substrate 11, protrusions 13 are provided as required, and grooves 14 are provided between the protrusions 13. The grooves 14 are in communication, and spaces are formed between a rear surface of the object to be processed W mounted on the electrostatic chuck 100 and the grooves 14.

The grooves 14 are connected to introduction paths 53 which pierce through the base plate 50 and the ceramic dielectric substrate 11. When a transfer gas such as helium (He) or the like is introduced from introduction paths 53 with the object to be processed W in a state of being adhered and held, the transfer gas flows into the space provided between the object to be processed W and the grooves 14, and the object to be processed W can be directly heated or cooled by the transfer gas.

The base plate 50 is provided with a through hole 57 such as a lift pin hole and a sensor hole, for example. The lift pin hole (the through hole 57 on a right side of the introduction path 53 in FIG. 1) pierces the base plate 50 and the ceramic dielectric substrate 11. A pin (not shown) removing the object to be processed W placed on the first major surface 11a from the electrostatic chuck 100 is inserted into the lift pin hole. The sensor hole (the through hole 57 on a left side of the introduction path 53 in FIG. 1) pierces the base plate 50. The sensor (not shown) sensing the temperature of the ceramic dielectric substrate 11 is installed in the sensor hole. That is, the through hole 57 sometimes pierces the base plate 50 and the ceramic dielectric substrate 11, on the other hand sometimes pierces the base plate 50 without piercing the ceramic dielectric substrate 11. The through hole 57 is not limited to the lift pin hole and the sensor hole or the like.

A connection portion 20 is provided on the second major surface 11b and the second major surface 11b of the ceramic dielectric substrate 11. A contact electrode 61 is provided in the upper portion 50a of the base plate 50 in a position corresponding to the position of the connection portion 20. Hence, when the electrostatic chuck 100 is attached to the upper portion 50a of the base plate 50, the contact electrode 61 contacts the connection portion 20 and electrical conduction can thereby be obtained between the contact electrode 61 and the electrode layer 12 via the connection portion 20.

For the contact electrode 61, a moveable probe may, for example, be used. Accordingly, a reliable connection is obtained between the contact electrode 61 and the connection portion 20, and damage to the connection portion 20 caused by the contact of the contact electrode 61 and the connection portion 20 can be minimized. It is noted that the contact electrode 61 is not limited to that described above, and may take any form. The contact electrode 61 may simply contact the connection portion 20, or engage with or be screwed into the connection portion 20.

Figure 2:
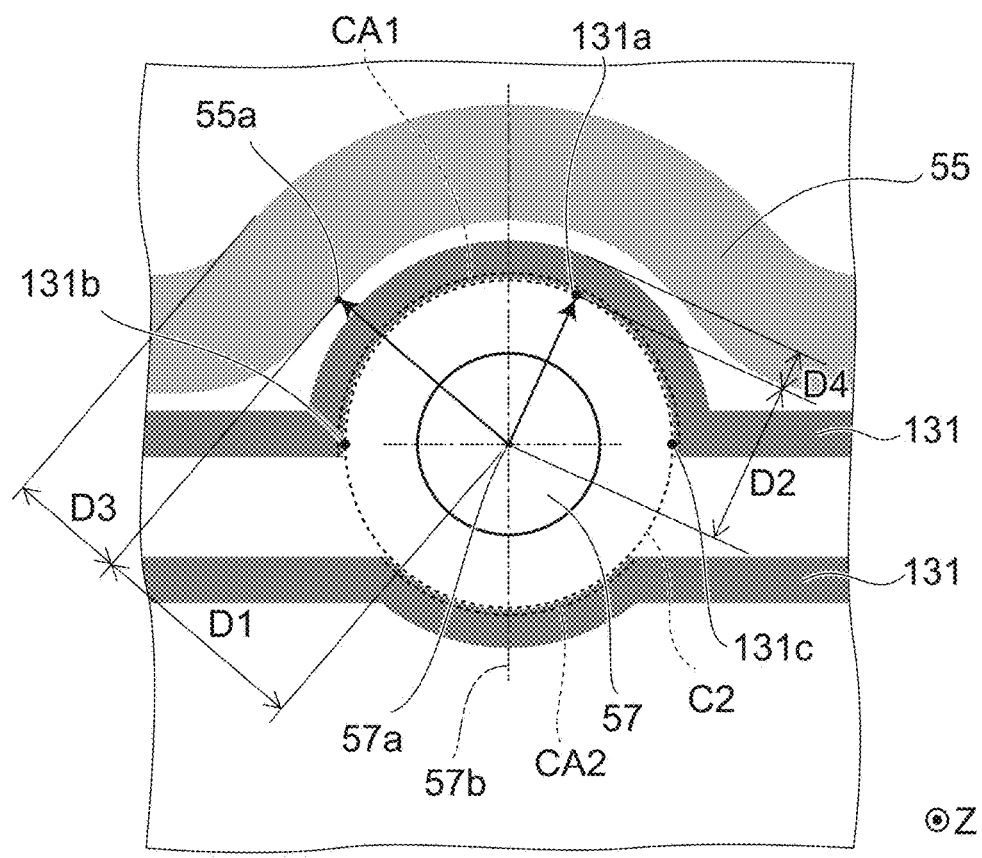
FIG. 2 is a schematic plan view showing a vicinity of a through hole of the embodiment.

FIG. 2 is a schematic plan view showing a vicinity of a through hole of the embodiment.

FIG. 2 is a schematic plan view of the electrostatic chuck 100 as viewed in a direction of an arrow A shown in FIG. 1. In other words, FIG. 2 is a schematic plan view of the electrostatic chuck 100 as viewed in a direction perpendicular to the first major surface 11a. It is noted that, in the schematic plan view shown in FIG. 2, the heater 131 and the communication path 55 are shown by solid lines instead of broken lines for convenience of description.

As shown in FIG. 2, when viewed in the direction perpendicular to the first major surface 11a, at least a part of the heater 131 exists on a side of the through hole 57 as viewed from a portion (first portion) 55a of the communication path 55 closest to the through hole 57. "The portion closest to the through hole 57" is referred to as, for example, a portion closest to a center axis 57a of the through hole 57 as viewed in the direction perpendicular to the first major surface 11a. In the communication path 55 shown in FIG. 2, the portion closest to the through hole 57 is the portion 55a.

When viewed in the direction perpendicular to the first major surface 11a, a distance D1 between the center axis 57a of the through hole 57 and the portion 55a of the communication path 55 closest to the through hole 57 is longer than a distance D2 between the center axis 57a of the through hole 57 and a portion (second portion) 131a of the heater 131 closest to the through hole 57.

When viewed in the direction perpendicular to the first major surface 11a, a width D3 of the communication path 55 in the portion 55a of the communication path 55 closest to the through hole 57 is wider than a width D4 of the heater 131 in the portion 131a of the heater 131 closest to the through hole 57. The width D3 is, for example, about not less than 5 millimeters (mm) and approximately not more than 10 mm. The width D4 is, for example, about not less than 0.5 mm and approximately not more than 3 mm.

When viewed in the direction perpendicular to the first major surface 11a, a diameter D7 (see FIG. 3) of the through hole 57 is, for example, not less than 0.05 mm and not more than 10 mm.

When viewed in the direction perpendicular to the first major surface 11a, it is desired that a part including the portion 131a of the heater 131 and a part including the portion 55a of the communication path 55 are in a shape surrounding the through hole 57. The shape surrounding the through hole 57 is referred to as an outward convex shape as seen from the through hole 57, and is desired to be in a generally circular arc having the through hole 57 as a center.

As shown in FIG. 2, when viewed in the direction perpendicular to the first major surface 11a, a circle approximated by the inner (side of the through hole 57) diameter of the heater 131 is defined as a second virtual circle C2. Alternatively, as shown in FIG. 2, when viewed in the direction perpendicular to the first major surface 11a, a circle passing the portion 131a of the heater 131 closest to the through hole 57 and any two portions (in FIG. 2, portion 131b and portion 131c) on the side of the trough hole 57 (inside) the heater 131 is defined as a second virtual circle C2. At this time, a length of the portion (in FIG. 2, circular arc CA1 and circular arc CA2) where the second virtual circle C2 crosses the heater 131 is not less than 50 percent (%) and not more than 80% of a length of circle perimeter of the second virtual circle C2.

The position of the communication path 55 and the position of the heater 131 are measured, for example, by using an X-ray CT (Computed Tomography). If it is only the position of the heater 131, it can be measured using, for example, an ultrasonic flaw detector. The position of the communication path 55 and the position of the heater 131 are also possible to be observed by a destructive inspection of the cross section or the like based on an electron microscopy such as scanning electron microscopy (SEM).

According to the embodiment, the uncontrollable range of temperature adjustment in the plane of the object to be processed can be limited by equalizing substantially a portion hardest to heat to a portion hardest to cool. In the embodiment, the portion hardest to heat to the portion hardest to cool are close to the through hole 57. Thereby, the uniformity of the temperature distribution in the plane of the object to be processed in other region different from the through hole can be improved. Also in the vicinity of the through hole, a region of cool spot hardest to heat is substantially equal to a region of hot spot hardest to cool, and thus equilibrium between heating and cooling is easily achieved, and the uniformity of the temperature distribution in the plane of the object to be processed can be improved.

Figure 3:
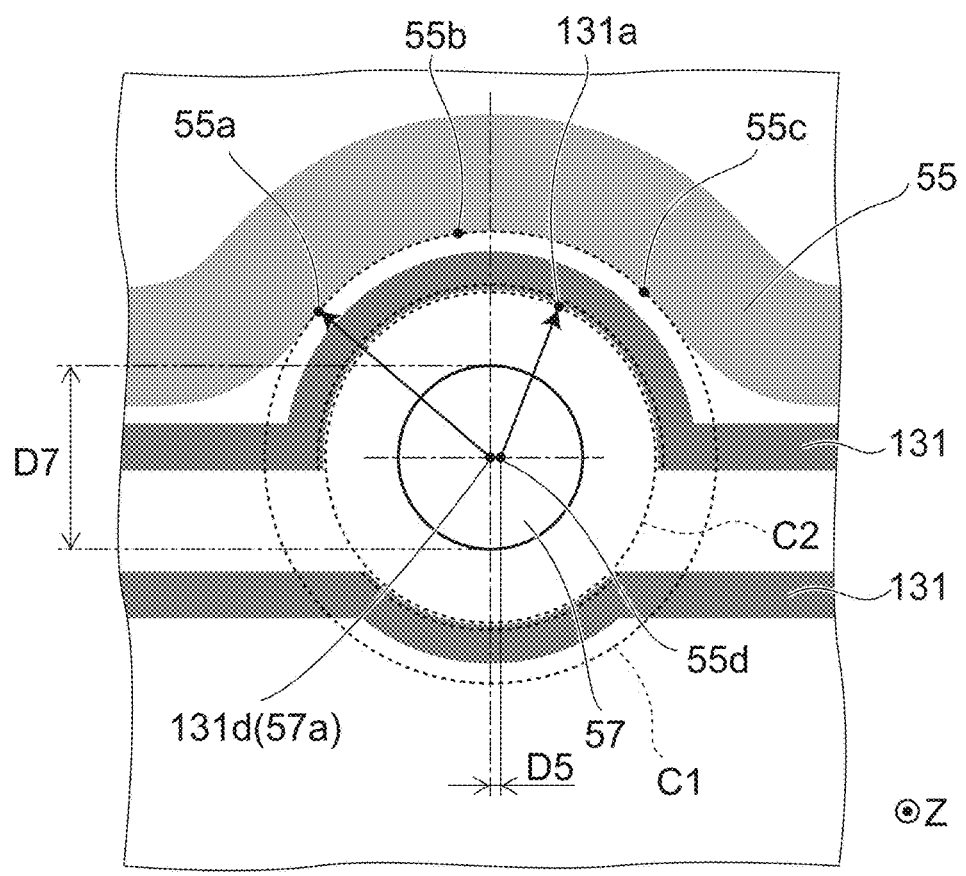
FIG. 3 is a schematic plan view showing the vicinity of the through hole of the embodiment.

FIG. 3 is a schematic plan view showing a vicinity of the through hole of the embodiment.

Figure 4:
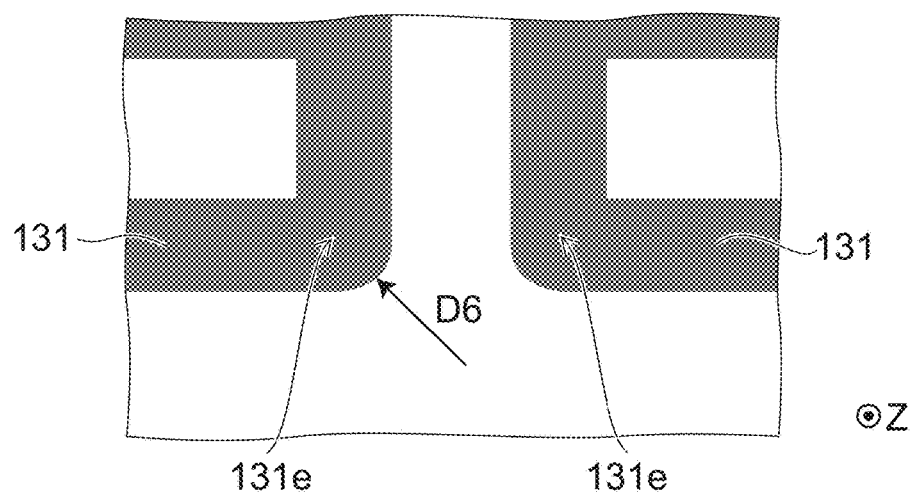
FIG. 4 is a schematic plan view showing a folded-back portion of a heater of the embodiment.

FIG. 4 is a schematic plan view showing a folded-back portion of the heater of the embodiment.

FIG. 3 is a schematic plan view of the electrostatic chuck 100 as viewed in the direction of the arrow A shown in FIG. 1. In other words, FIG. 3 is a schematic plan view of the electrostatic chuck 100 as viewed in a direction perpendicular to the first major surface 11a. It is noted that, in the schematic plan view shown in FIG. 3, the heater 131 and the communication path 55 are shown by solid lines instead of broken lines for convenience of description.

As shown in FIG. 3, when viewed in the direction perpendicular to the first major surface 11a, a circle approximated by the inner (side of the through hole 57) diameter of the communication path 55 is defined as a first virtual circle C1. Alternatively, as shown in FIG. 2, when viewed in the direction perpendicular to the first major surface 11a, a circle passing the portion 55a of the communication path 55 closest to the through hole 57 and any two portions (in FIG. 3, portion 55b and portion 55c) on the side (inside) of the trough hole 57 of the communication path 55 is defined as a first virtual circle C1. At this time, a distance D5 between a center 55d of the first virtual circle C1 and a center 131d of the second virtual circle C2 is within 0.2 mm. At this time, as shown in FIG. 4, a dimension D6 of a portion (round portion) on the outer side (outer circumference) of the folded-back portion 131e of the heater 131 is, for example, about not less than 0.6 mm and approximately not more than 1 mm (not less than R 0.6, not more than R1).

It is preferable that a distance between the center 55d of the first virtual circle C1 and the center 131d of the second virtual circle C2 is 0 mm. That is, it is preferable that the center 55d of the first virtual circle C1 overlaps the center 131d of the second virtual circle C2.

Figure 5:
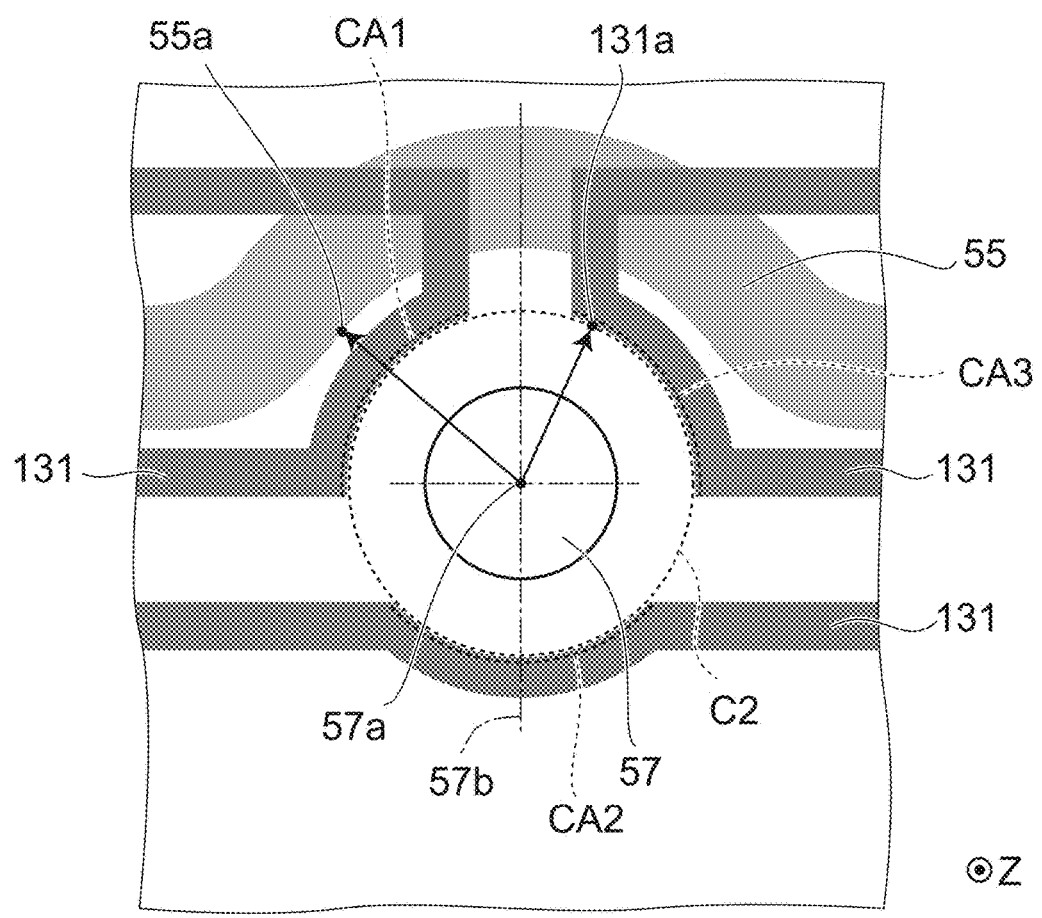
FIG. 5 is a schematic plan view showing a vicinity of one other through hole of the embodiment.

FIG. 5 is a schematic plan view showing a vicinity of one other through hole of the embodiment.

FIG. 5 is a schematic plan view of the electrostatic chuck 100 as viewed in the direction of the arrow A shown in FIG. 1 similar to FIG. 2 and FIG. 3.

An arrangement pattern of the heater 131 in the vicinity of the through hole 57 shown FIG. 5 is different from an arrangement pattern of the heater 131 in the vicinity of the through hole 57 shown in FIG. 2 and FIG. 3. In the vicinity of the through hole 57 shown in FIG. 2 and FIG. 3, the upper side heater is continuous. On the other hand, In the vicinity of the through hole 57 shown in FIG. 5, the upper side heater is not continuous. In any example shown in FIG. 2, FIG. 3 and FIG. 5, when viewed in the direction perpendicular to the first major surface 11a, the arrangement pattern of the heater 131 is bilaterally symmetric about an arbitrary straight line 57b passing the center axis 57a of the through hole 57. In the case where the through hole 57 is a lift pin hole, it is relatively frequent that the arrangement pattern of the heater 131 is laterally symmetric as seen from the arbitrary straight line 57b passing the center axis 57a of the through hole 57.

As shown in FIG. 5, even in the case of the arrangement pattern of the heater 131, when viewed in the direction perpendicular to the first major surface 11a, at least a part of the heater 131 exists on a side of the through hole 57 as viewed from a portion 55a of the communication path 55 closest to the through hole 57. A length of the portion (in FIG. 5, circular arc CA1, circular arc CA2 and circular arc CA3) where the second virtual circle C2 crosses the heater 131 is not less than 50 percent (%) and not more than 80% of a length of circle perimeter of the second virtual circle C2.

The distance D1, the distance D2, the width D3, the width D4, the distance D5 and the dimension D6 are as described above with respect to FIG. 2 and FIG. 3.

Figure 6A:
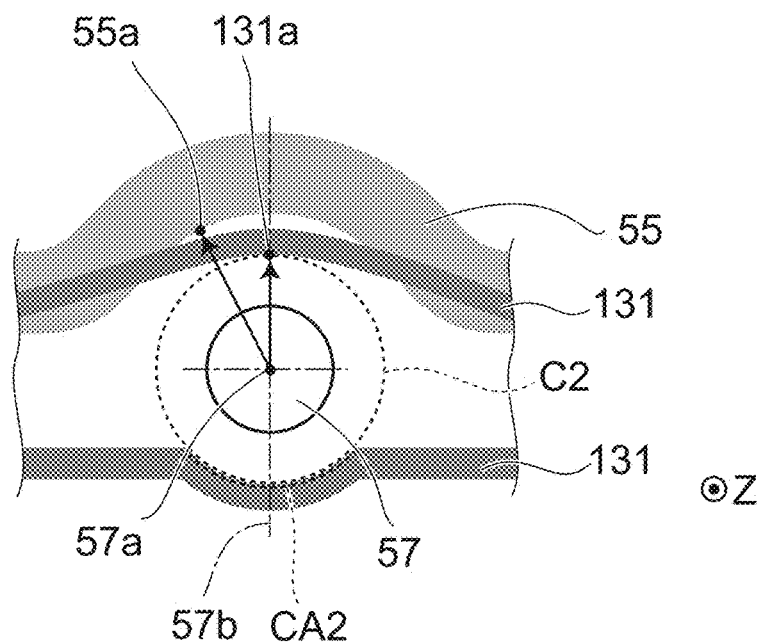
FIG. 6A and FIG. 6B are schematic views showing the vicinity of the one other through holes of the embodiment.
Figure 6B:
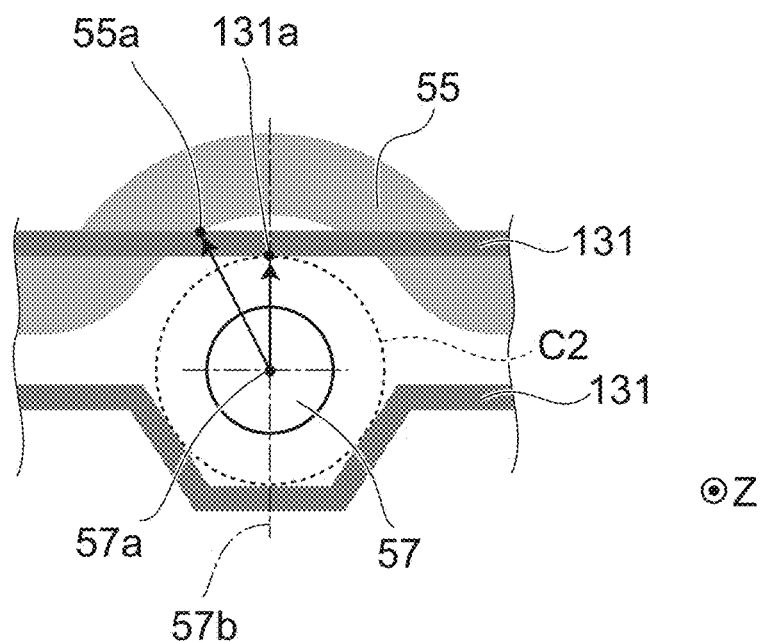

FIG. 6A and FIG. 6B are schematic views showing the vicinity of the one other through holes of the embodiment. FIG. 6A and FIG. 6B are schematic plan views of the electrostatic chuck 100 as viewed in the direction of the arrow A shown in FIG. 1 similar to FIG. 2 and FIG. 3.

A curvature of a planar shape of the upper side heater 131 in FIG. 6A is larger than a curvature of a planar shape of the upper side heater 131 in the vicinity of the through hole 57 shown in FIG. 2 and FIG. 3. In FIG. 6A, a part of the upper side heater 131 overlaps a part of the communication path 55 in the Z-direction in the vicinity of the through hole 57. In FIG. 6B, the heater 131 is configured from the pattern extending linearly along the X-Y plane. Also in examples shown in FIG. 6A and FIG. 6B, the distance D1, the distance D2, the width D3, the width D4, and the distance D5 are as described above with respect to FIG. 2 and FIG. 3. Thereby, the uniformity of the temperature distribution in the plane of the object to be processed can be improved.

Figure 7A:
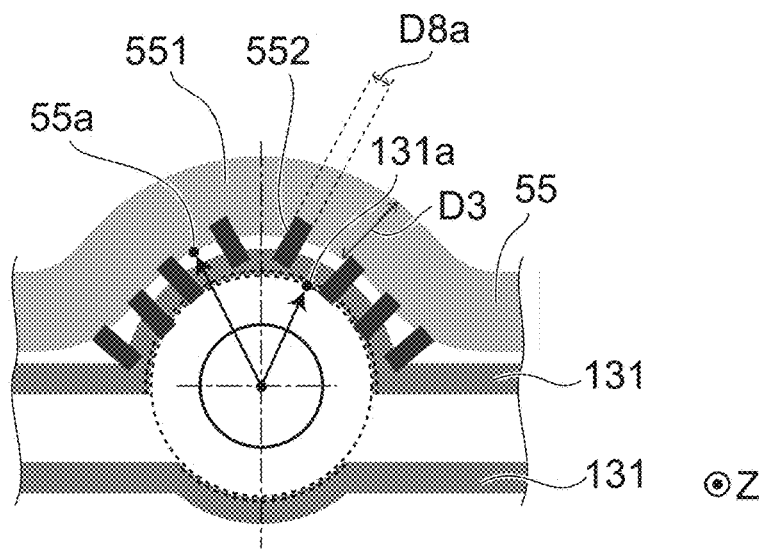
FIG. 7A and FIG. 7B are schematic views showing the vicinity of the one other through holes of the embodiment.
Figure 7B:
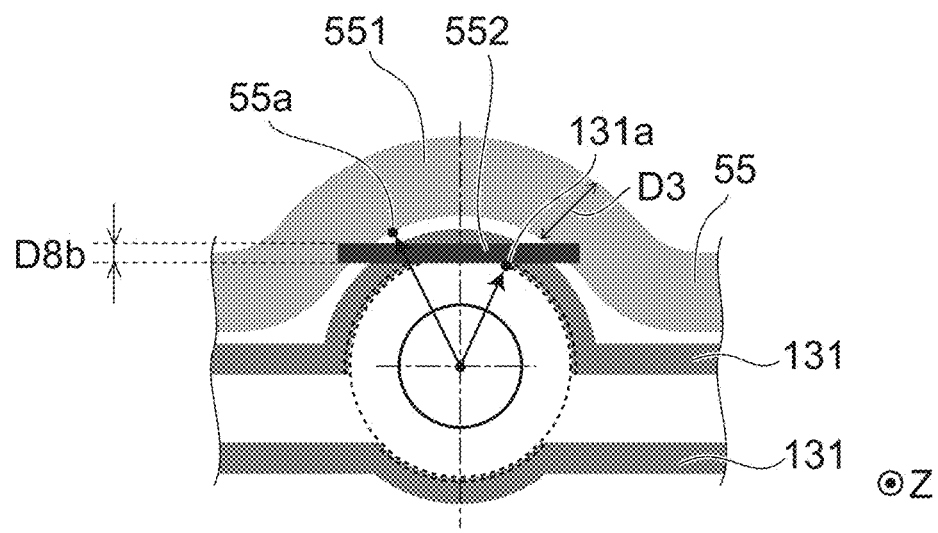

FIG. 7A and FIG. 7B are schematic views showing the vicinity of the one other through holes of the embodiment. FIG. 7A and FIG. 7B are schematic plan views of the electrostatic chuck 100 as viewed in the direction of the arrow A shown in FIG. 1 similar to FIG. 2 and FIG. 3.

Examples shown in FIG. 7A and FIG. 7B are different from examples shown in FIG. 2 and FIG. 3 in the arrangement pattern of the communication path 55. In the examples of FIG. 7A and FIG. 7B, the communication path 55 branches into a main flow path 551 and a sub flow path 552 in the vicinity of the through hole 57. As shown in FIG. 7A, a width D8a of the sub flow path 552 is narrower than the width D3 of the main flow path 551. As shown in FIG. 7B, a width D8b of the sub flow path 552 is narrower than the width D3 of the main flow path 551. The width of the flow path is a length of the flow path along the direction perpendicular to a direction along which the cooling medium flows into when viewed in the direction perpendicular to the first major surface 11a.

In the specification of the application, when the communication path 55 branches off in this manner, "the portion 55a of the communication path 55 closest to the through hole 57" is referred to as "the portion of the main flow path 551 closest to the through hole 57". In such a case, also in the examples shown in FIG. 7A and FIG. 7B, the distance D1, the distance D2 the width D3, the width D4 and the distance D5 are as described above with respect to FIG. 2 and FIG. 3.

Figure 8:
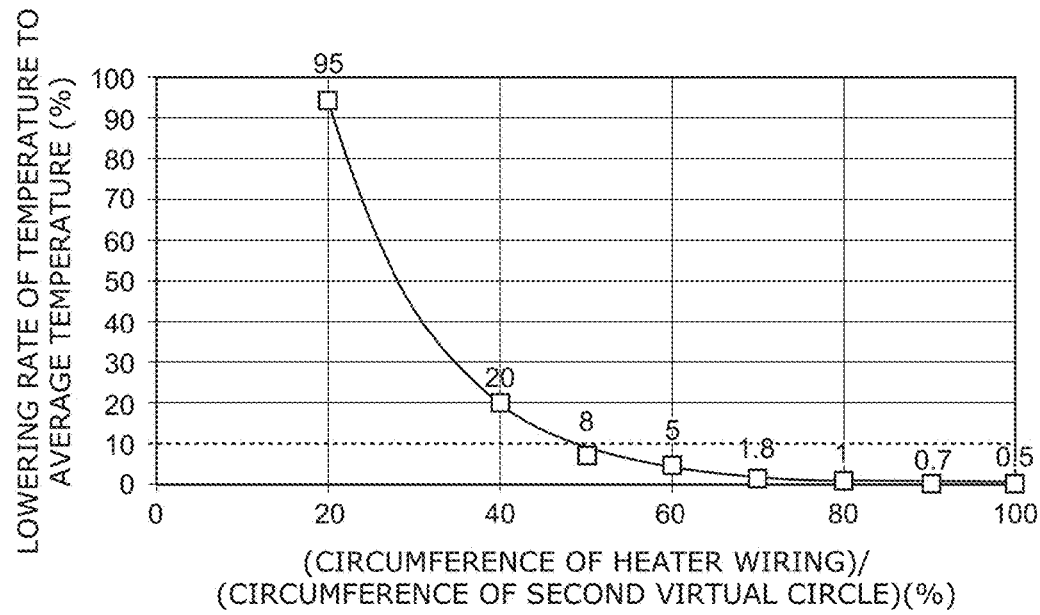
FIG. 8 is a graph chart illustrating an example of the relationship between a ratio of a circumference and a lowering rate of the temperature.

FIG. 8 is a graph chart illustrating an example of the relationship between a ratio of a circumference and a lowering rate of the temperature.

The horizontal axis of the graph chart shown in FIG. 8 represents a ratio between the length of the portion where the second virtual circle C2 crosses the heater 131 and the length of the circular perimeter of the second virtual circle C2 (the length of the portion where the second virtual circle C2 crosses the heater 131/the length of the circular perimeter of the second virtual circle C2 (%)). The vertical axis of the graph chart shown in FIG. 8 represents the lowering rate of the temperature to the average temperature (%).

As shown in FIG. 8, if the ratio between the length of the portion where the second virtual circle C2 crosses the heater 131 and the length of the circular perimeter of the second virtual circle C2 is high, the lowering rate of the temperature to the average temperature is low. The lowering rate of the temperature to the average temperature is favorable to be not more than 10%. If the lowering rate of the temperature to the average temperature is higher than 10%, it becomes difficult to heat adequately the region in the vicinity of the through hole 57.

That is, in the case where the ratio between the length of the portion where the second virtual circle C2 crosses the heater 131 and the length of the circular perimeter of the second virtual circle C2 is less than 50%, the heater 131 in the vicinity of the through hole 57 is deficient. Thereby, it becomes difficult to heat adequately the region in the vicinity of the through hole 57. In other words, the region in the vicinity of the through 57 may be the cool spot.

On the other hand, in the case where the ratio between the length of the portion where the second virtual circle C2 crosses the heater 131 and the length of the circular perimeter of the second virtual circle C2 is higher than 80%, the heater 131 in the vicinity of the through hole 57 is excessive. Therefore, there is a fear that an insulation distance between the heaters 131 cannot be secured.

According to this, the ratio between the length of the portion where the second virtual circle C2 crosses the heater 131 and the length of the circular perimeter of the second virtual circle C2 is favorable to be not less than 50% and not more than 80%.

The ratio between the length of the portion where the second virtual circle C2 crosses the heater 131 and the length of the circular perimeter of the second virtual circle C2 is preferable to be not less than 70% and not more than 80%. In such a case, relatively many heaters 131 can be provided in the vicinity of the through hole 57 while securing the insulation distance between the heaters 131.

Figure 9:
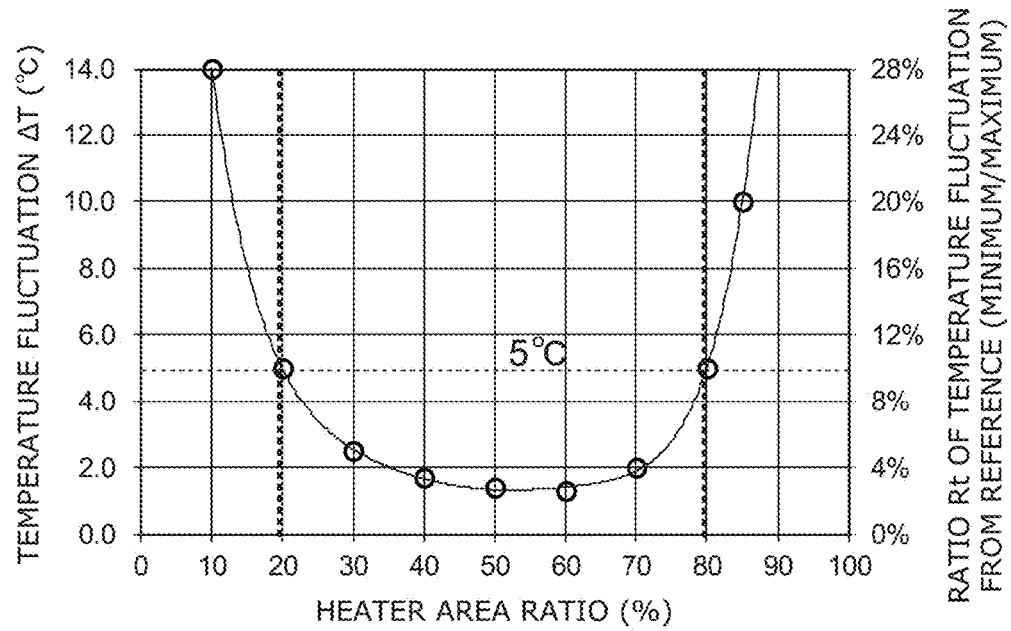
FIG. 9 is a graph chart illustrating an example of the relationship between a temperature fluctuation and a heater area ratio.

FIG. 9 is a graph chart illustrating an example of the relationship between a temperature fluctuation and a heater area ratio.

The horizontal axis of the graph chart shown in FIG. 9 represents a heater area ratio (%). The heater area ratio is a ratio of the area of the heater 131 to the area of the ceramic dielectric substrate 11, when viewed in the direction perpendicular to the first major surface 11a.

The left vertical axis of FIG. 9 represents the temperature fluctuation $\Delta T$ (° C.) of the object to be processed W (for example, wafer) placed on the electrostatic chuck and having the temperature controlled. The temperature fluctuation $\Delta T$ is a temperature difference between the highest temperature position and the lowest temperature position.

The right vertical axis of FIG. 9 represents a ratio Rt (%) of the temperature fluctuation from the reference of the object to be processed W. For example, in the case where the temperature of the object to be processed W is changed from the temperature T1 to the temperature T2 by the electrostatic chuck, ratio Rt (%)=(temperature fluctuation $\Delta T$)/(temperature T2−temperature T1)×100 is represented.

In FIG. 9, in the electrostatic chuck described with reference to FIG. 1, the heater area ratio can be changed by changing the width of the heater 131 or arranging the heater 131 densely. As shown in FIG. 9, in the case where the heater area ratio is not more than 20%, the temperature fluctuation $\Delta T$ is not less than 5° C., the ratio Rt Is not less than 10%. If the heater area ratio is further decreased, the temperature fluctuation $\Delta T$ and the ratio Rt increase steeply. This is considered to be because of difficulty of heating the region away from the heater 131 when the heater 131 is sparse.

On the other hand, also in the case where the heater area ratio is not less than 80%, the temperature fluctuation $\Delta T$ is not less than 5° C., and the ratio Rt is not less than 10%. If the heater area ratio further increases, the temperature fluctuation $\Delta T$ and the ratio Rt increase steeply. This is considered to be because that the region having the heaters 131 arranged densely is easily heated but the region having the heaters 131 not arranged remains difficult to be heated. Therefore, the temperature difference is remarkable.

The heater area ratio is limited by a factor other than the temperature fluctuation as well. For example, for securing the insulation distance, the distance of closest approach between the heaters 131 is desired to be not less than 0.2 mm and not more than 5 mm, and the distance from the heater 131 to the outer circumference of the ceramic dielectric substrate 11 is desired to be not less than 0.05 mm and not more than 7 mm. Therefore, the heater area ratio is less than 100%. For example, when the heater area ratio is not less than 90%, the breakdown voltage between the heaters is insufficient, and when the heater area ratio is not less than 85%, the breakdown voltage between the heater outer circumferences is insufficient.

According to the above, in the embodiment, the heater area ratio is desired to be not less than 20% and not more than 80%. Thereby, the uniformity of the temperature distribution in the plane of the object to be processed can be improved. The heater area ratio is desired to be not less than 40% and not more than 60%. Thereby, the temperature fluctuation $\Delta T$ can be not more than 2° C. and the ratio Rt can be not more than 4%.

Figure 10:
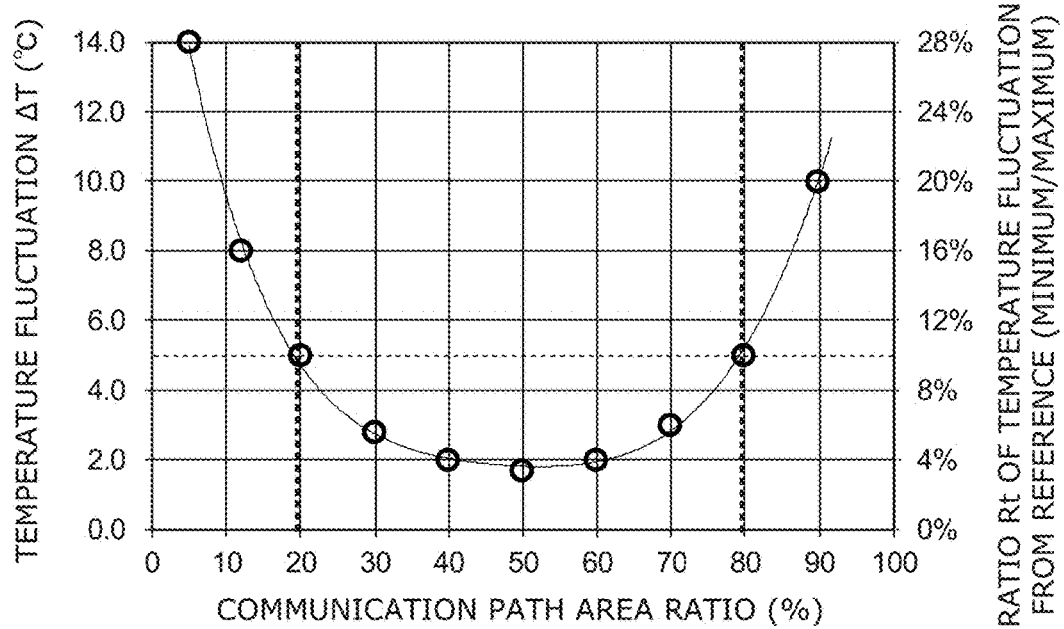
FIG. 10 is a graph chart illustrating an example of the relationship between the temperature fluctuation and a communication path area ratio.

FIG. 10 is a graph chart illustrating an example of the relationship between the temperature fluctuation and the communication path area ratio. The horizontal axis represents the communication path area ratio (%). The communication path area ratio is a ratio of the communication path 55 to the area of the ceramic dielectric substrate 11, when viewed in the direction perpendicular to the first major surface 11a.

The left vertical axis of FIG. 10 represents the temperature fluctuation $\Delta T$ (° C.) similar to the left vertical axis of FIG. 9. The right vertical axis of FIG. 10 represents the ratio Rt (%) of the temperature fluctuation from the reference similar to the right vertical axis of FIG. 9.

In FIG. 10, in the electrostatic chuck described with reference to FIG. 1, the communication path area ratio can be changed by changing the width of the communication path 55 or arranging the communication path 55 densely. In this example, the cooling medium is caused to pass through the communication path 55.

As shown in FIG. 10, when the communication path area ratio is not more than 20%, the temperature fluctuation $\Delta T$ is not less than 5° C., and the ratio Rt is not less than 10%. If the communication path area ratio is further decreased, the temperature fluctuation $\Delta T$ and the ratio Rt increase steeply. This is considered to be because that the region away from the communication path 55 is easy to be the hot spot when the communication path 55 is sparse.

On the other hand, also in the case where the communication path area ratio is not less than 80%, the temperature fluctuation $\Delta T$ is not less than 5° C., and the ratio Rt is not less than 10%. If the communication path area ratio is further increased, the temperature fluctuation $\Delta T$ and the ratio Rt increase steeply. This is considered to be because that the region having the communication path 55 arranged densely is easily cooled but the region having the communication path 55 not arranged remains difficult to be cooled. Therefore, the temperature difference is remarkable.

The communication path area ratio is limited by a factor other than the temperature fluctuation as well. For example, for securing the strength, the distance of closest approach between the communication paths 55 is desired to be not less than 0.3 mm and not more than 15 mm, and the distance from the communication path 55 to the outer circumference (outer circumference of upper portion 50a) of the base plate 50 is desired to be not less than 0.3 mm and not more than 10 mm. Therefore, the communication path area ratio is less than 100%.

According to the above, in the embodiment, the communication path area ratio is desired to be not less than 20% and not more than 80%. Thereby, the uniformity of the temperature distribution in the plane of the object to be processed can be improved. The communication path area ratio is preferable to be not less than 40% and not more than 60%. Thereby, the temperature fluctuation ΔT can be not more than 2° C. and the ratio Rt can be not more than 4%.

Figure 11:
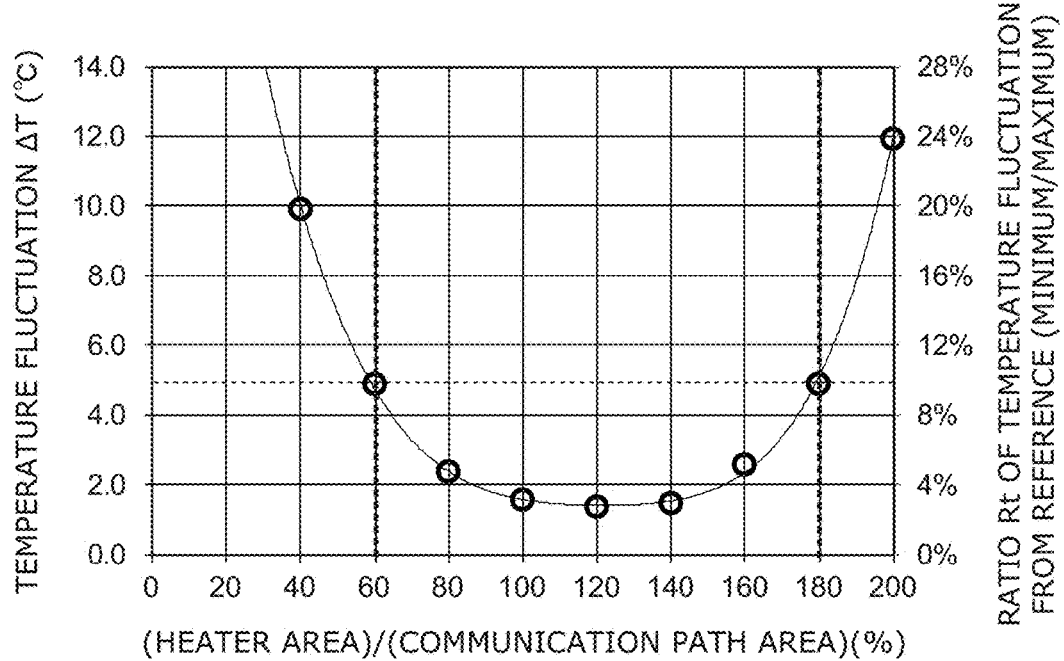
FIG. 11 is a graph chart illustrating an example of the relationship between the temperature fluctuation and a ratio of the heater area to the communication path area.

FIG. 11 is a graph chart illustrating an example of the relationship between the temperature fluctuation and the ratio of the heater area to the communication path area.

The horizontal axis of FIG. 11 represents a ratio of the heater area to the communication path area. This is calculated by (heater area)/(communication path area) (%). The heater area is an area of the heater 131 as viewed in the direction perpendicular to the first major surface 11a. The communication path area is the area of the communication path 55 as viewed in the direction perpendicular to the first major surface 11a.

The left vertical axis of FIG. 11 represents the temperature fluctuation ΔT (° C.) similar to the left vertical axis of FIG. 9. The right vertical axis of FIG. 11 represents the ratio Rt (%) of the temperature fluctuation from the reference similar to the right vertical axis of FIG. 9.

In FIG. 11, in the electrostatic chuck described with reference to FIG. 1, a ratio of the heater area to the communication path area can be changed by changing the width of the heater 131 and the width of the communication path 55 or arranging the heater 131 and the communication path 55 densely. Here, the minimum value of the width of the heater is 0.5 mm, and the minimum value of the width of the communication path 55 is 1 mm. In this example, the cooling medium is caused to pass through the communication path 55. The temperature of the object to be processed W is controlled by heating by the heater 131 while flowing the cooling medium into the communication path 55.

As shown in FIG. 11, when the ratio of the heater area to the communication path area is not more than 60%, the temperature fluctuation ΔT is not less than 5° C., and the ratio Rt is not less than 10%. If the ratio of the heater area to the communication path area is further decreased, the temperature fluctuation ΔT and the ratio Rt increase steeply. This is considered to be because that the density of the communication path 55 to the heater 131 is high, and the cool spot occurs easily.

On the other hand, also in the case where the ratio of the heater area to the communication path area is not less than 180%, the temperature fluctuation ΔT is not less than 5° C., and the ratio Rt is not less than 10%. If the ratio of the heater area to the communication path area is further increased, the temperature fluctuation ΔT and the ratio Rt increase steeply. This is considered to be because that the density of the heater 131 to the communication path 55 is high, and the hot spot occurs easily.

According to the above, in the embodiment, it is desired that both of the heater 131 and the communication path 55 arranged with an adequate density. The ratio of the heater area to the communication path area is desired to be not less than 60% and not more than 180%. Thereby, the uniformity of the temperature distribution in the plane of the object to be processed can be improved. The ratio of the heater area to the communication path area is preferable to be not less than 100% and not more than 140%. Thereby, the temperature fluctuation ΔT can be not more than 2° C. and the ratio Rt can be not more than 4%.

It is noted that the heater area ratio in FIG. 9, the communication path area ratio in FIG. 10, and the ratio of the heater area to the communication path area in FIG. 11 may be calculated with respect to the whole adhesion surface of the electrostatic chuck 100, respectively, may be calculated with respect to the range surrounded by the outer circumference of the electrostatic chuck 100, and may be calculated in the range of approximately 50 mm×50 mm of the electrostatic chuck 100. The average value of calculated values from the multiple (approximately three) ranges of 50 mm×50 mm may be used, respectively for the heater area ratio, the communication path area ratio, and the ratio of the heater area to the communication path area.

Figure 12A:
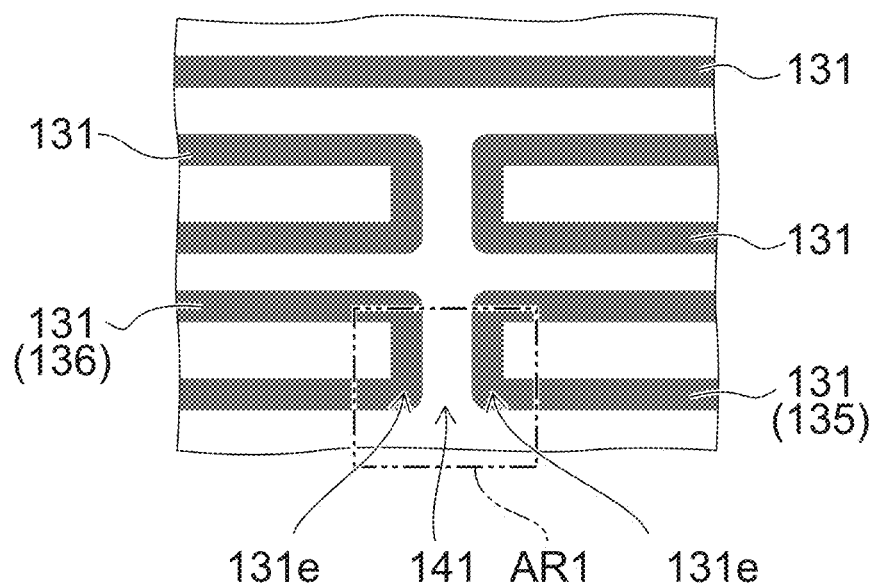
FIG. 12A and FIG. 12B are schematic plan views showing a folded-back portion of the heater.
Figure 12B:
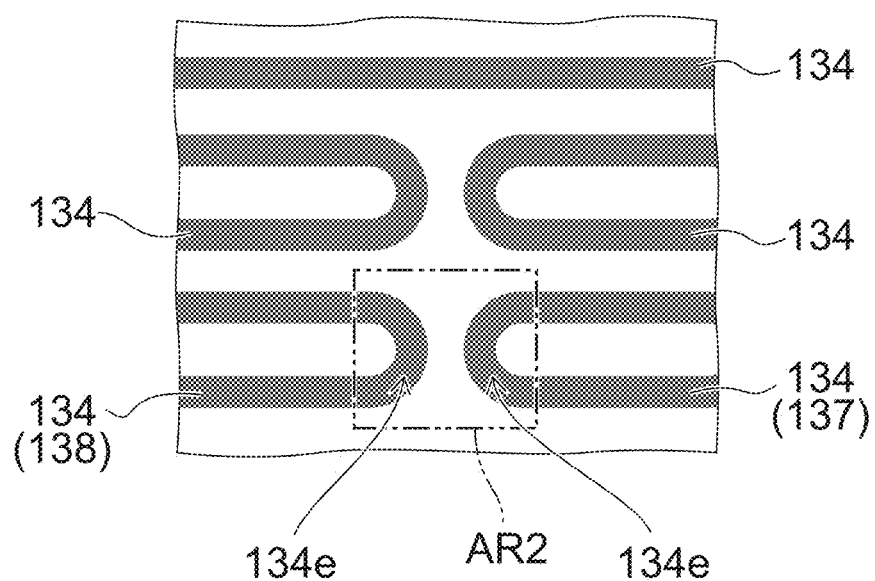

FIG. 12A and FIG. 12B are schematic plan views showing a folded-back portion of the heater.

Figure 13A:
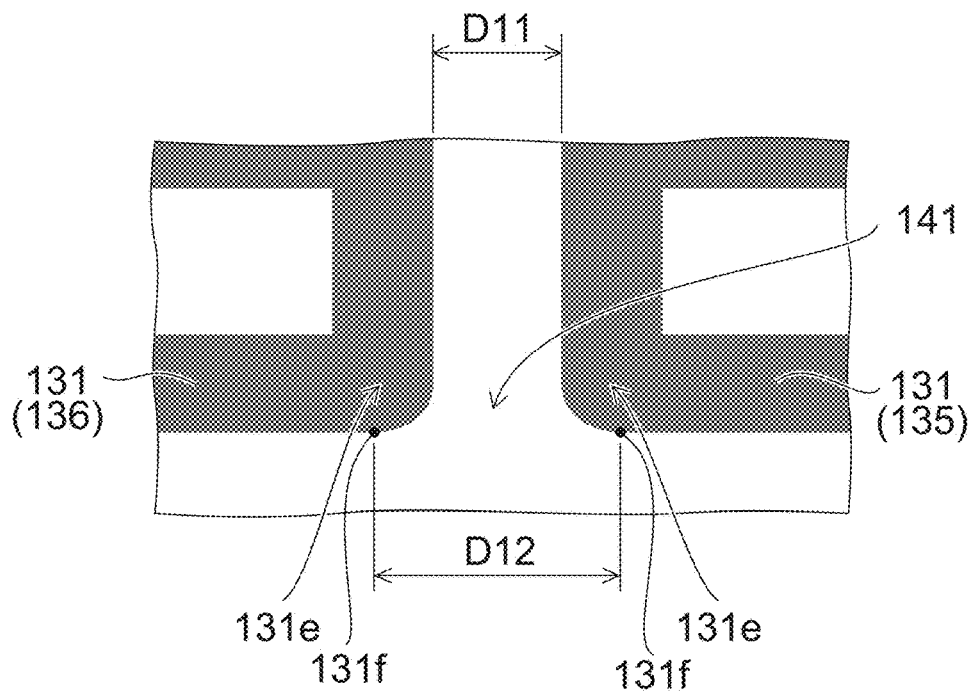
FIG. 13A and FIG. 13B are schematic enlarged views enlarging the folded-back portion of the heater.
Figure 13B:
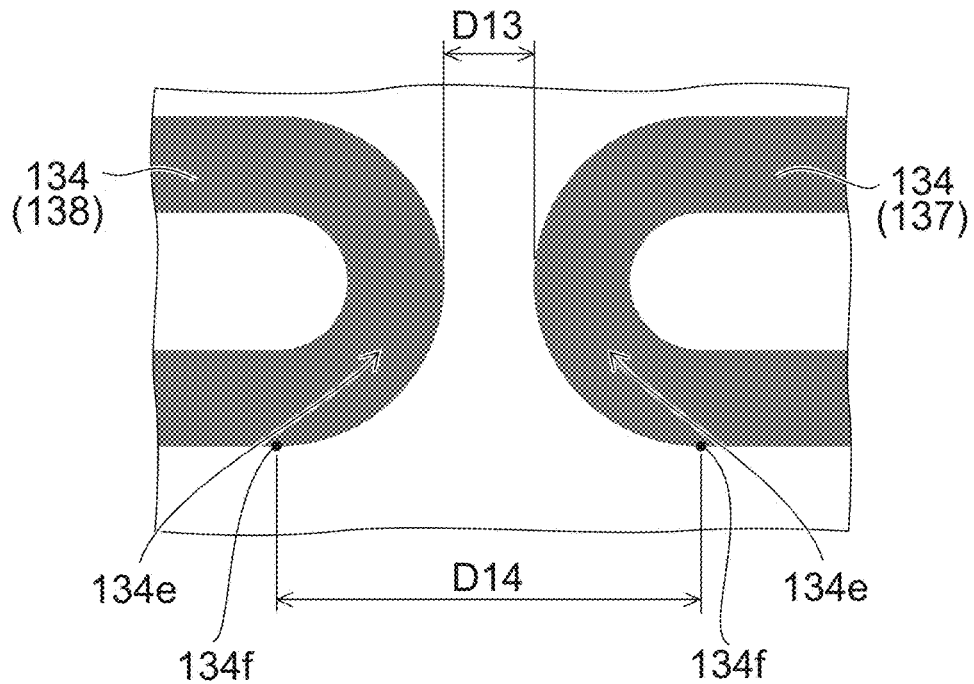

FIG. 13A and FIG. 13B are schematic enlarged views enlarging the folded-back portion of the heater.

FIG. 12A is the schematic plan view showing the folded-back portion of the heater of the embodiment. FIG. 12B is the schematic plan view showing the folded-back portion of the heater of a comparative example. FIG. 13A is the schematic enlarged view enlarging a region AR1 shown in FIG. 12A. FIG. 13B is the schematic enlarged view enlarging a region AR2 shown in FIG. 12B.

FIG. 12A shows a state of close folded-back portions 131e of multiple heaters 131. The folded-back portions 131e of the heaters 131 are portions bent from a first direction to a second direction different from the first direction. FIG. 12B shows a state of close folded-back portions 134e of multiple heaters 134. The folded-back portions 134e of the heaters 134 are portions bent from a third direction to a fourth direction different from the third direction. In an arrangement pattern of the heaters 131 shown in FIG. 12A, a first heater 135 is close to a second heater 136. In an arrangement pattern of the heaters 134, a first heater 137 is close to a second heater 138.

If an area of a space portion 141 between the folded-back portion 131e (first folded-back portion) of the first heater 135 and the folded-back portion 131e (second folded-back portion) of the second heater 136 is broad, the temperature controllability of the object to be processed W is lowered, and thus the uniformity of the temperature distribution in the plane of the object to be processed W may be difficult to be improved. Contrarily, when the area of the space portion 141 the folded-back portion 131e of the first heater 135 and the folded-back portion 131e of the second heater 136 is adequate, the temperature controllability of the object to be processed W can be improved, and the uniformity of the temperature distribution in the plane of the object to be processed W can be improved.

Here, as shown in FIG. 13A, in the embodiment, a distance of closest approach between the first heater 135 and the second heater 135 is denoted as "D11". A distance between a round end portion 131f of the folded-back portion 131e of the first heater 135 and a round end portion 131f of the folded-back portion 131e of the second heater 136 is denoted as "D12".

In the specification, "round end portion" refers to the intersection of the round portion and the linear portion.

As shown in FIG. 13B, in the comparative example, a distance of closest approach between the first heater 137 and the second heater 138 is denoted as "D13". A distance between a round end portion 134f of the folded-back portion 134e of the first heater 137 and a round end portion 134f of the folded-back portion 134e of the second heater 138 is denoted as "D14".

At this time, in the embodiment, a ratio (D11/D12) of the distance of closest approach D11 to the distance D12 between the round end portions 131f is not less than 50% and less than 100%. In other words, the distance of closest approach D11 is not less than 50% and less than 100% of the distance D12 between the round end portions 131f.

Contrarily, in the comparative example, a ratio (D13/D14) of the distance of closest approach D13 to the distance D14 between the round end portions 134f is less than 50%. In other words, the distance of closest approach D13 is less than 50% of the distance D14 between the round end portions 134f.

According to the embodiment, the distance of closest approach between the multiple heaters 131 is defined in order to define a density of the space portion 141 in the portion of the closest folded-back portions 131e of the multiple heaters 131, and thus the temperature controllability of the object to be processed W can be improved and the uniformity of the temperature distribution of the object to be processed W can be improved.

The ratio of the distance of closest approach to the distance between the round end portions will be further described with reference to drawings.

Figures 14, 15:
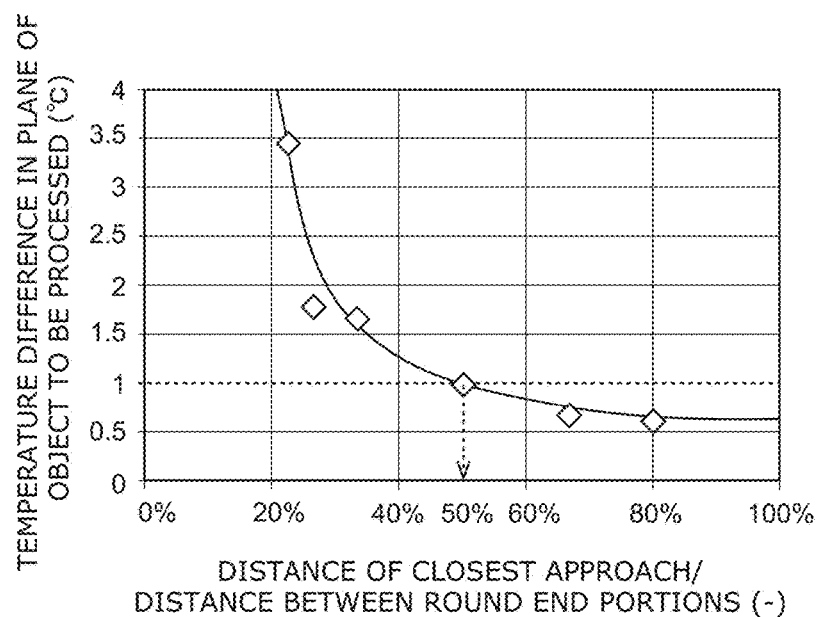
FIG. 14 is a graph chart illustrating an example of the relationship between a ratio of a distance of closest approach to a distance between round end portions and temperature difference in the plane of the object to be processed.
FIG. 15 is a table illustrating an example of the relationship between a ratio of a distance of closest approach to a distance between round end portions and temperature difference in the plane of the object to be processed.
Figure 16A:
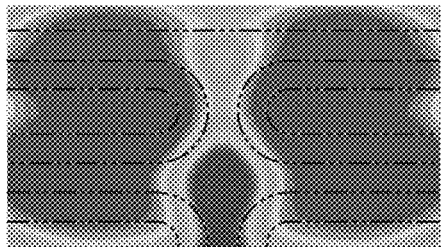
FIG. 16A to FIG. 16E are schematic views illustrating an example of the temperature distribution in the plane of the object to be processed.
Figure 16D:
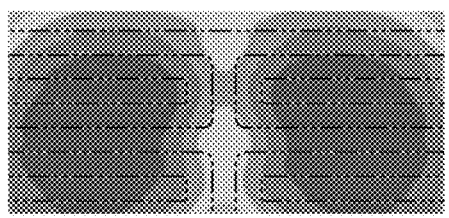
Figure 16B:
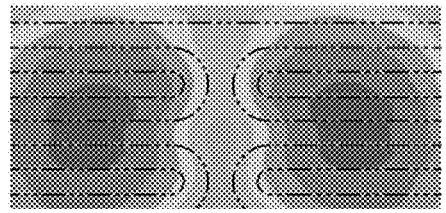
Figure 16E:
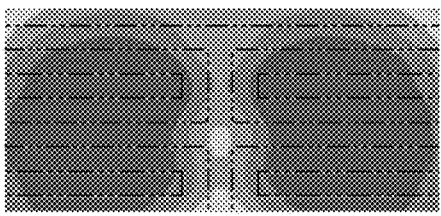
Figure 16C:
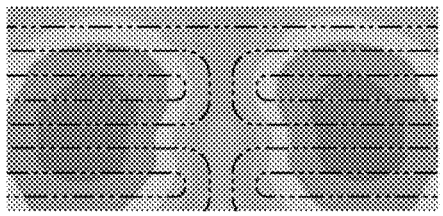

FIG. 14 is a graph chart illustrating an example of the relationship between a ratio of a distance of closest approach to a distance between round end portions and temperature difference in the plane of the object to be processed.

FIG. 15 is a table illustrating an example of the relationship between a ratio of a distance of closest approach to a distance between round end portions and temperature difference in the plane of the object to be processed.

FIG. 16A to FIG. 16E are schematic views illustrating an example of the temperature distribution in the plane of the object to be processed.

The inventors have investigated the relationship between a ratio of the distance of closest approach to the distance between round end portions (the distance of closest approach/the distance between the round end portions) and temperature difference in the plane of the object to be processed. As shown in FIG. 15, the inventors have investigated the temperature difference in the plane of the object to be processed W about the cases where the ratio of the distance of closest approach to the distance between round end portions is 22% (Case 1), 26% (Case 2), 33% (Case 3), 50% (Case 4), 67% (Case 5) and 80% (Case 6).

One example of results of the investigation is as shown in FIG. 14 to FIG. 16E. That is, as shown in FIG. 14 and FIG. 14, if the ratio of the distance of closest approach to the distance between the round end portions is higher, the temperature difference in the plane of the object to be processed W is lowered. In the case where the temperature difference in the plane of the object to be processed W is set to be not more than 1° C., the ratio of the distance of closest approach to the distance between the round end portions is necessary to be not less than 50% and less than 100%. As shown in FIG. 16A to FIG. 16E, in the case where the ratio of the distance of closest approach to the distance between the round end portions is not less than 50% and less than 100%, lowering of the temperature in the space portion 141 between the folded-back portion 131e of the first heater 135 and the folded-back portion 131e of the second heater 136 is suppressed.

Figure 17A:
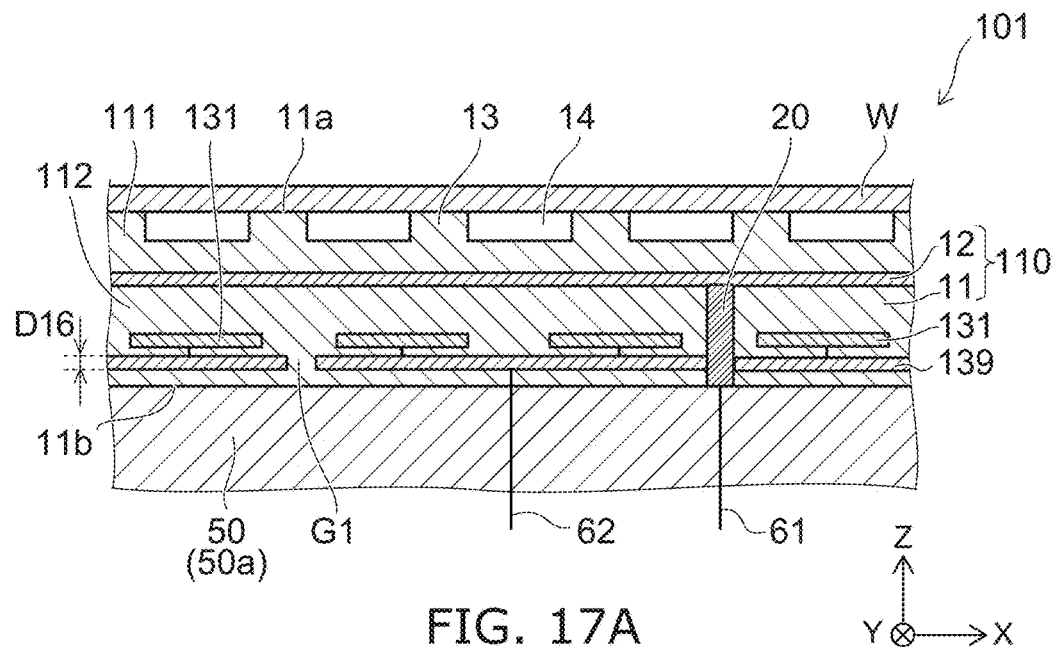
FIG. 17A and FIG. 17B are schematic views illustrating one other electrostatic chuck according to the embodiment.
Figure 17B:
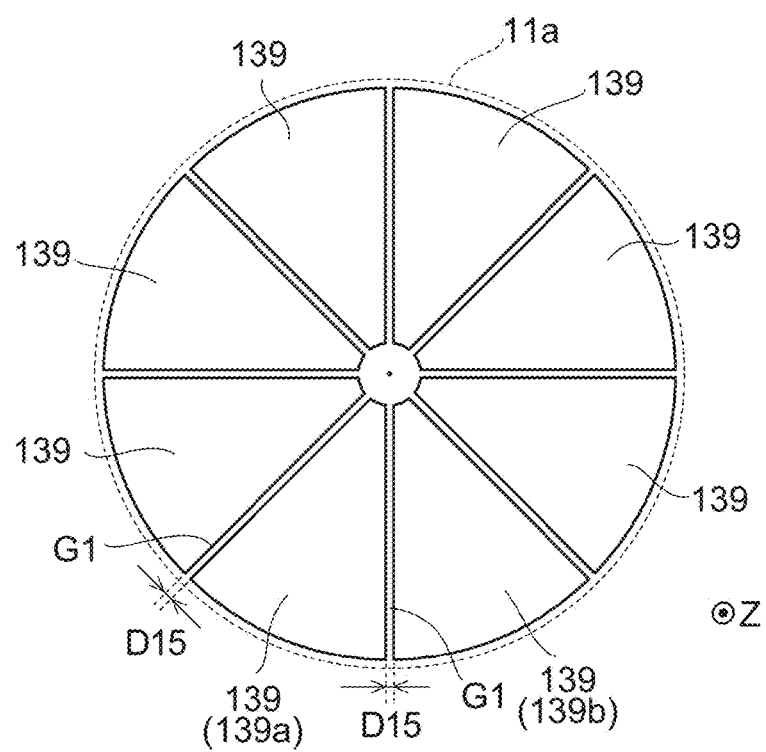

FIG. 17A and FIG. 17B are schematic views illustrating one other electrostatic chuck according to the embodiment.

FIG. 17A is a schematic cross-sectional view of an electrostatic chuck 101 according to the embodiment. FIG. 17B corresponds to a schematic cross-sectional view enlarging a part of the cross section shown in FIG. 1.

The electrostatic chuck 101 illustrated in FIG. 17A includes a bypass electrode 139. Other than this, the similar description about the electrostatic chuck 100 described in FIG. 1 can be applied to the electrostatic chuck 101. The example shown in FIG. 17A is about the heater plate structure, but the heater or the bypass electrode may be included in ceramic, and the structure and the manufacturing method are not limited.

The bypass electrode 139 is provided between the base plate 50 and the electrode layer 12 in the Z-direction. In this example, the bypass electrode 139 is located between the base plate 50 and the heater 131 in the Z-direction. However, the position of the bypass electrode 139 is not limited thereto. For example, the bypass electrode 139 may be located between the electrode layer 12 and the heater 131 in the Z-direction.

Materials for the bypass electrode include, for example, a metal including at least one of stainless steel, titanium, chromium, nickel, copper or aluminum. The bypass electrode 139 is electrically connected to the heater 131. The bypass electrode 139 is electrically connected to an terminal 62. The heater current 133 (see FIG. 1) can be flown through the terminal 62 and the bypass electrode 139. By providing the bypass electrode 139 like this, the freedom of arrangement of the terminal 62 and the heater 131 can be higher. The heater 131 does not contact directly the terminal 52, and thus the heater 131 can be suppressed from damage.

FIG. 17B is a schematic plan view illustrating the bypass electrode of the embodiment.

As shown in FIG. 17B, the electrostatic chuck 101 is provided with the multiple bypass electrodes 139. When viewed in the direction perpendicular to the first major surface 11a, it is desired that the first major surface 11a is substantially circular, and the multiple bypass electrodes 139 overlaps substantially the whole of the first major surface 11a. In this example, eight bypass electrodes 139 are provided. The planar shape of each of the bypass electrodes 139 is, for example, substantially fan-shaped. This fan shape is surrounded by the arc along the outer circumference of the first major surface 11a and two radiuses of the arc. However, for example, the bypass electrode may be substantially comb-shaped and may be substantially circular, and the shape of the bypass electrode is not limited thereto.

The electrostatic chuck 101 has a gap G1. The gap G1 is a region between mutually adjacent two bypass electrodes 139 (for example, first bypass electrode 139a, and a second bypass electrode 139b). The in-plane uniformity of the current supplied to the heater 131, for example, can be improved by providing the multiple bypass electrodes 139 so as to divide the circle.

Figure 18:
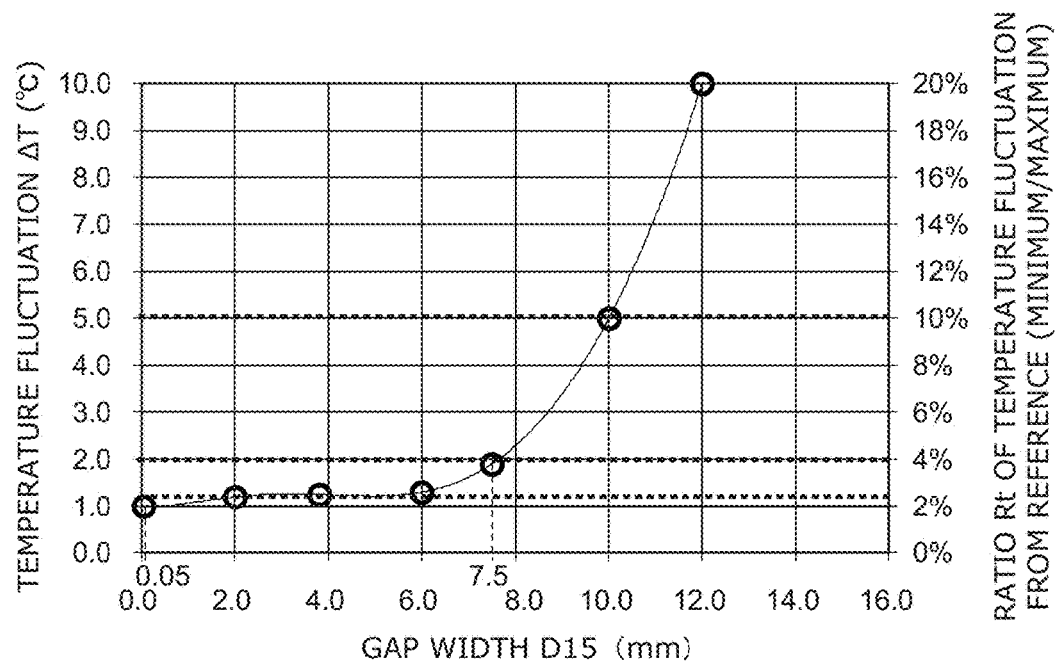
FIG. 18 is a graph chart illustrating an example of the relationship between the temperature fluctuation and a gap width of a bypass electrode.

FIG. 18 is a graph chart illustrating an example of the relationship between the temperature fluctuation and a gap width of a bypass electrode.

The horizontal axis of FIG. 18 represents a gap width D15 of the bypass electrode 139. The gap width D15 is a width of the gap G1 shown in FIG. 17B. In other words, the gao width D15 is a distance between the mutually adjacent two bypass electrodes in a circumferential direction of the electrostatic chuck 101. The left vertical axis of FIG. 18 represents the temperature fluctuation ΔT (° C.) similar to the left vertical axis of FIG. 9. The right vertical axis of FIG. 18 represents the ratio Rt (%) of the temperature fluctuation from the reference similar to the right vertical axis of FIG. 9.

FIG. 18 illustrates the characteristics of the case where the multiple gap widths D15 are changed in the electrostatic chuck 101. As shown in FIG. 18, when the gap width D15 Is not more than 10 mm, the temperature fluctuation ΔT is not more than 5° C., and the ratio Rt is not more than 10%. This is considered to be because that the gap G1 is easy to function like as a heat insulating layer. In the case where the gap width D15 is less than 0.05 mm, a breakdown voltage between the bypass electrodes 139 may be lowered. In the embodiment, the gap width D15 is desired to be not less than 0.05 mm and not more than 10 mm. Thereby, the uniformity of the temperature distribution in the plane of the object to be processed can be improved. The gap width D15 is preferably to be not less than 0.05 mm and not more than 7.5 mm, furthermore preferably to be not less than 0.05 mm and not more than 2.0 mm.

Figure 19:
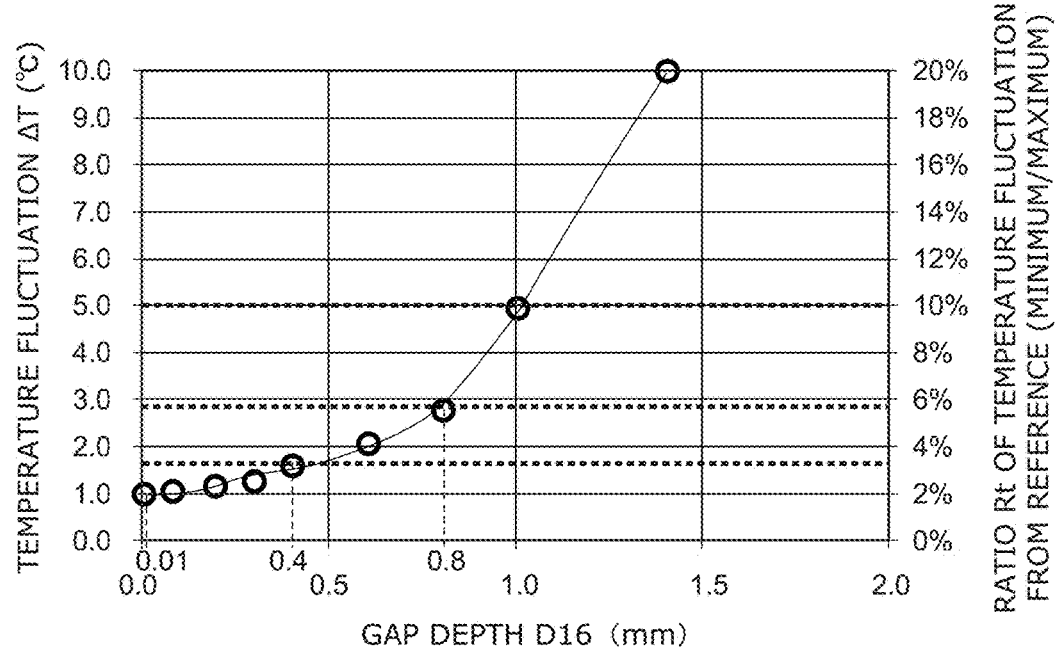
FIG. 19 is a graph chart illustrating an example of the relationship between the temperature fluctuation and a gap depth of a bypass electrode.

FIG. 19 is a graph chart illustrating an example of the relationship between the temperature fluctuation and a gap depth of a bypass electrode.

The horizontal axis of FIG. 19 represents a gap depth D16 of the bypass electrode 139. The gap depth D16 is a depth of the gap G1 (a length along the direction perpendicular to the first major surface 11a) shown in FIG. 17A. In other words, the gap depth D16 corresponds to a thickness of the bypass electrode 139. The left vertical axis of FIG. 19 represents the temperature fluctuation ΔT (° C.) similar to the left vertical axis of FIG. 9. The right vertical axis of FIG. 19 represents the ratio Rt (%) of the temperature fluctuation from the reference similar to the right vertical axis of FIG. 9.

FIG. 19 illustrates the characteristics of the case where the gap depth D16 is changed. As shown in FIG. 19, when the gap depth D16 is not more than 1 mm, the temperature fluctuation ΔT is not more than 5° C., the ratio Rt is not more than 10%. In the embodiment, the gap depth D16 is desired to be not less than 0.01 mm and not more than 1 mm. Thereby, the uniformity of the temperature distribution in the plane of the object to be processed can be improved. The gap depth D16 is preferably not less than 0.01 mm and not more than 0.8 mm, furthermore preferably not less than 0.01 mm and not more than 0.4 mm.

Figure 20:
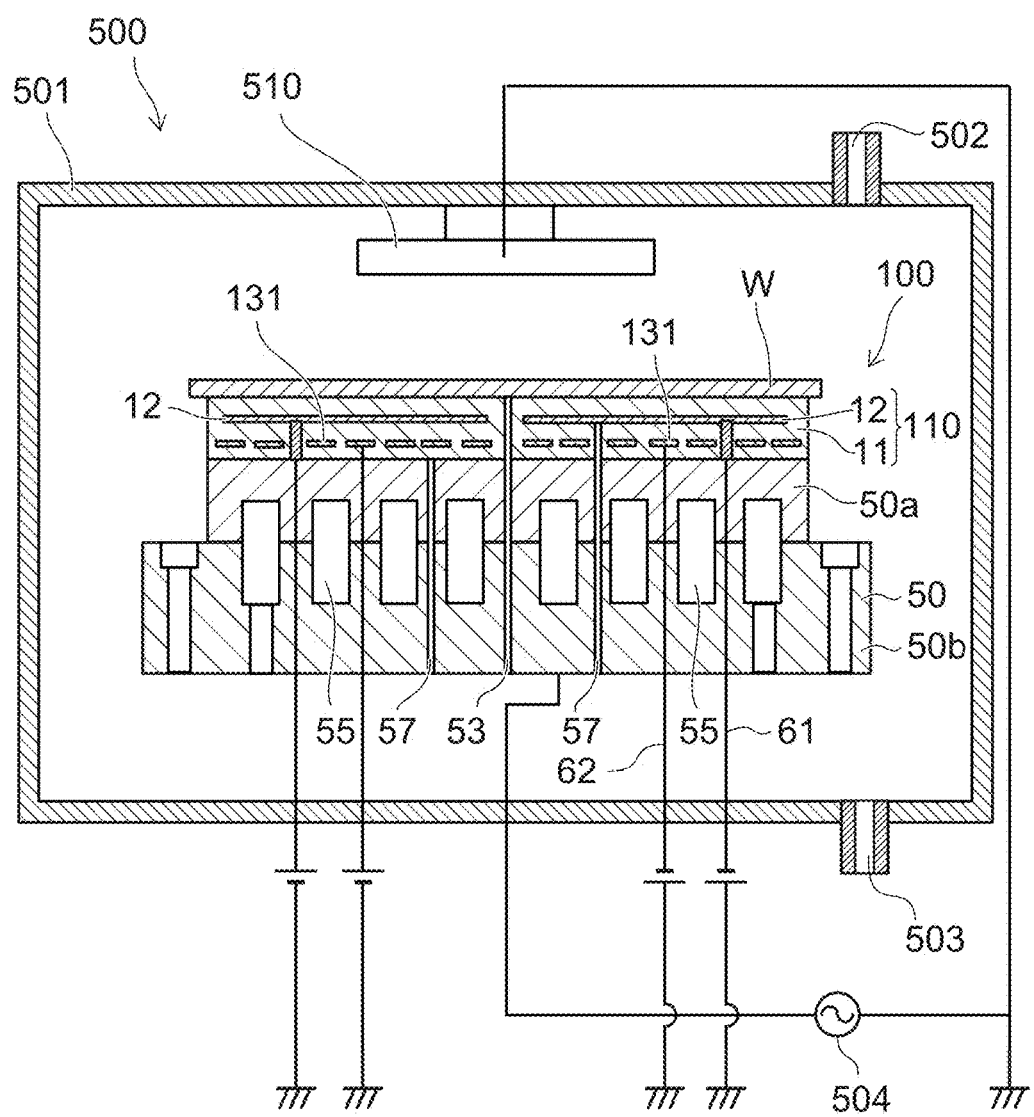
FIG. 20 is a schematic cross-sectional view illustrating a wafer processing apparatus according to one other embodiment of the invention.

FIG. 20 is a schematic cross-sectional view illustrating a wafer processing apparatus according to one other embodiment of the invention.

A wafer processing apparatus 500 according to the embodiment includes a processing chamber 501, an upper electrode 510, and the electrostatic chuck (for example, electrostatic chuck 100) previously described with reference to FIG. 1 to FIG. 9. A ceiling of the processing chamber includes a processing gas introduction port 502 for introducing the processing gas into the inside. A bottom plate of the processing chamber 501 includes an exhaust port 503 for reducing a pressure to exhaust the inside. A high frequency power supply 504 is connected to the upper electrode 510 and the electrostatic chuck 100, and a pair of electrodes including the upper electrode 510 and the electrostatic chuck 10 is configured to oppose in parallel to be separated from each other with a prescribed spacing.

In the wafer processing apparatus 500 according to the embodiment, if a high frequency voltage is applied between the upper electrode 510 and the electrostatic chuck 10, high frequency discharge is generated, the processing gas introduced into the processing chamber 501 is excited and activated by a plasma, and the object to be processed W is subjected to be processed. The object to be processed W may include a semiconductor substrate (wafer). However, the object to be processed W Is not limited to the semiconductor substrate (wafer), and, for example, may be a glass substrate used for a liquid crystal display device.

The high frequency power supply 504 is electrically connected to the base plate 50 of the electrostatic chuck 100. The base plate 50 includes a metal material such as aluminum or the like as described previously. That is, the base plate 50 is conductive. Thereby, the high frequency voltage is applied between the upper electrode 510 and the base plate 50.

A apparatus having the configuration like the wafer processing apparatus 500 is called generally a parallel plate type RIE (Reactive Ion Etching) apparatus, however the electrostatic chuck 100 according to the embodiment is not limited to application to this device. For example, it can be broadly applied to a so called pressure reduction processing apparatus such as an ECR (Electron Cyclotron Resonance) etching apparatus, an inductively coupled plasma processing apparatus, a helicon wave plasma processing apparatus, a plasma separation type plasma processing apparatus, a surface wave plasma processing apparatus, and a plasma CVD (Chemical Vapor Deposition) apparatus. The electrostatic chuck 100 according to the embodiment can be applied broadly to a substrate processing apparatus which the processing and inspection are performed under atmospheric pressure like an exposure device and an inspection device as well. However, considering high plasma resistance of the electrostatic chuck 100 according to the embodiment, the electrostatic chuck 100 is favorable to be applied to the plasma processing apparatus. Among the configuration of these apparatus, the public known configuration can be applied to parts other than the electrostatic chuck 100 according to the embodiment, and thus the description will be omitted.

Hereinabove, exemplary embodiments of the invention are described with reference to specific examples. However, the embodiments of the invention are not limited to these specific examples. The exemplary embodiments described above can be modified appropriately by a person skilled in the art, and such modifications are also encompassed within the scope of the invention to the extent that the purport of the invention is included. For example, shapes, dimensions, materials, and arrangement of the respective components included the electrostatic chuck 100, the electrostatic chuck substrate 110 and the baseplate 50, and the placement of the heater 131 and the through hole 57 are not limited to the illustrated and can be modified appropriately.

The respective components included in the embodiments described above can be combined within the extent of technical feasibility and are included in the scope of the invention to the extent that the spirit of the invention is included.

INDUSTRIAL APPLICABILITY

According to one embodiment of the invention, an electrostatic chuck and a wafer processing apparatus capable of improving uniformity of the temperature distribution in a plane of an object to be processed are provided.

EXPLANATION OF LETTERS OR NUMERALS 11 ceramic dielectric substrate
11a first major surface
11b second major surface 12 electrode layer
13 protrusion
14 groove
20 connection portion
50 base plate
50a upper portion
50b lower portion
51 input path
52 output path
53 introduction path
55 communication path
55a, 55b, 55c portion
55d center
57 through hole
57a center axis
57b straight line
61 contact electrode
80 adhere and hold voltage
100, 101 electrostatic chuck
110 electrostatic chuck substrate
111 first dielectric layer
112 second dielectric layer
131 heater
131a, 131b, 131c portion
131d center
131e folded-back portion
131f round end portion
132 heater electrode current introduction portion
133 heater current
134 heater
134e folded-back portion
134f round end portion
135 first heater
136 second heater
137 first heater
138 second heater
139 bypass electrode
139a first bypass electrode
139b second bypass electrode
141 space portion
500 wafer processing apparatus
501 processing chamber
502 processing gas introduction port
503 exhaust port
504 high frequency power supply
510 upper electrode
551 main flow path
552 sub flow path

The invention claimed is:

1. An electrostatic chuck comprising:
a ceramic dielectric substrate having a first major surface on which an object to be processed is mounted, and a second major surface on a side opposite to the first major surface, the ceramic dielectric substrate being a polycrystalline ceramic sintered body;
an electrode layer provided on the ceramic dielectric substrate;
a base plate provided on a side of the second major surface and supporting the ceramic dielectric substrate; and
a heater provided between the electrode layer and the base plate,
the base plate having a through hole piercing a portion thereof, the base plate further having a communication path formed internally therein for passing a medium for adjusting a temperature of the object to be processed, and
wherein, when viewed in a direction perpendicular to the first major surface,
at least a part of the heater is disposed between the through hole and a first portion of the communication path which is closest to the through hole, said part of the heater having a shape which encloses a portion of the through hole, and
a part of the communication path, which includes the first portion, has a shape which encloses said portion of the through hole.

2. The electrostatic chuck according to claim 1, wherein when viewed in the direction perpendicular to the first major surface, a distance between the first portion and a center axis of the through hole is larger than a distance between a second portion of the heater which is closest to the through hole and the center axis of the through hole.

3. The electrostatic chuck according to claim 2, wherein when viewed in the direction perpendicular to the first major surface, a distance between a center of a first virtual circle passing the first portion and any two portions on the side of the through hole of the communication path and a center of a second virtual circle passing the second portion and any two portions on the side of the through hole of the heater is not more than 0.2 millimeters.

4. The electrostatic chuck according to claim 2, wherein when viewed in the direction perpendicular to the first major surface, a center of a first virtual circle passing the first portion and any two portions on the side of the through hole of the communication path overlaps a center of a second virtual circle passing the second portion and any two portions on the side of the through hole of the heater.

5. The electrostatic chuck according to claim 2, wherein when viewed in the direction perpendicular to the first major surface, a width of the communication path in the first portion is wider than a width of the heater in the second portion.

6. The electrostatic chuck according to claim 3, wherein when viewed in the direction perpendicular to the first major surface, a length of a portion where the second virtual circle crosses the heater is not less than 50 percent and not more than 80 percent of a length of circle perimeter of the second virtual circle.

7. The electrostatic chuck according to claim 1, wherein the heater includes:
a first heater having a first folded-back portion bent from a first direction to a second direction different from the first direction, and
a second heater having a second folded-back portion provided to be close to the first heater and bent from a third direction to a fourth direction different from the third direction,
and wherein a distance of closest approach between the first folded-back portion and the second folded-back portion is between 50 percent and 100 percent of a distance between a round end portion of the first folded-back portion and a round end portion of the second folded-back portion.

8. The electrostatic chuck according to claim 1, wherein when viewed in the direction perpendicular to the first major surface, a ratio of an area of the heater to an area of the ceramic dielectric substrate is not less than 20% and not more than 80%.

9. The electrostatic chuck according to claim 1, wherein when viewed in the direction perpendicular to the first major surface, a ratio of an area of the communication path to an area of the ceramic dielectric substrate is not less than 20% and not more than 80%.

10. The electrostatic chuck according to claim 1, wherein when viewed in the direction perpendicular to the first major surface, a ratio of an area of the heater to an area of the communication path is not less than 60% and not more than 180%.

11. The electrostatic chuck according to claim 1, further comprising a plurality of bypass electrodes provided between the electrode layer and the base plate and electrically connected to the heater,
   wherein a distance between mutually adjacent bypass electrodes of the plurality of bypass electrodes is not less than 0.05 millimeters and not more than 10 millimeters.

12. The electrostatic chuck according to claim 1, further comprising a plurality of bypass electrodes provided between the electrode layer and the base plate and electrically connected to the heater,
   wherein a length along the direction perpendicular to the first major surface of a region between mutually adjacent bypass electrodes of the plurality of bypass electrodes is not less than 0.01 millimeters and not more than 1 millimeter.

13. A wafer processing apparatus comprising the electrostatic chuck according to claim 1.

* * * * *